(12) United States Patent
Singh et al.

(10) Patent No.: US 11,803,467 B1
(45) Date of Patent: *Oct. 31, 2023

(54) REQUEST BUFFERING SCHEME

(71) Applicant: Ambarella International LP, Santa Clara, CA (US)

(72) Inventors: Manish Singh, Campbell, CA (US); Dingxin Jin, Milpitas, CA (US)

(73) Assignee: Ambarella International LP, Santa Clara, CO (US)

( * ) Notice: Subject to any disclaimer, the term of this patent is extended or adjusted under 35 U.S.C. 154(b) by 43 days.

This patent is subject to a terminal disclaimer.

(21) Appl. No.: 17/703,248

(22) Filed: Mar. 24, 2022

Related U.S. Application Data

(63) Continuation of application No. 17/165,942, filed on Feb. 3, 2021, now Pat. No. 11,360,890.

(51) Int. Cl.
*G06F 12/06* (2006.01)
*G06F 13/40* (2006.01)
*G11C 11/401* (2006.01)

(52) U.S. Cl.
CPC .......... *G06F 12/06* (2013.01); *G06F 13/4022* (2013.01); *G06F 2212/1016* (2013.01); *G11C 11/401* (2013.01)

(58) Field of Classification Search
CPC .. G06F 12/06; G06F 12/0215; G06F 13/4022; G06F 2212/1016
See application file for complete search history.

(56) References Cited

U.S. PATENT DOCUMENTS

2021/0248094 A1 * 8/2021 Norman .............. G06F 12/0877

* cited by examiner

*Primary Examiner* — Ernest Unelus
(74) *Attorney, Agent, or Firm* — Christopher P. Maiorana, PC

(57) ABSTRACT

An apparatus including a plurality of page circuits and a common request circuit. The page circuits may each be implemented within a respective memory bank controller of a memory bank set and store an address and determine a page hit status. The common request circuit may be implemented within the memory bank set and store client requests and issue a command corresponding to the client requests in response to the page hit status and an order of storage of the client requests. The page circuits may comprise half a storage depth of the common request circuit. The common request circuit may be shared between each of the memory bank controllers of the memory bank set. The memory bank controllers may control access to a random access memory. The address, the client requests and the page hit status may enable buffering to provide a preview of upcoming client requests.

20 Claims, 12 Drawing Sheets

REQUEST BUFFERING SCHEME

This application relates to U.S. application Ser. No. 17/165,942, filed on Feb. 3, 2021, which is hereby incorporated by reference in its entirety.

FIELD OF THE INVENTION

The invention relates to data access generally and, more particularly, to a method and/or apparatus for implementing a request buffering scheme.

BACKGROUND

Modern computing demands low latency memory access. With an ever increasing need of more external memory bandwidth, the speed of memories is increasing. Memory access is efficient when accessing an open page and there is a penalty when there is a page miss. With high speed and high density memory, a page miss penalty also increases. LPDDR4 and LPDDR5 are examples of modern high speed and high density memories.

The latest memories can have a burst size of 64 bytes and can complete a memory access transaction in two cycles (32 bit DRAM bus). A page miss time (i.e., an amount of time taken to close a page and open another page in the same bank of a memory) can last for 50+ cycles. The page miss penalty results in a significant bandwidth loss.

Applications can be tuned to keep page miss to a minimum but, with so many processes running, page misses are hard to avoid completely. Memory controllers need to properly do page management to hide the time needed to close a page and open another page. One method of hiding a page miss to avoid bandwidth loss is by continuing to perform data transfers from past requests, while doing efficient page management for future requests. To perform data transfers from past requests, memory controllers need to see more requests from the future in order to efficiently organize the memory accesses. However, memory controllers are also required to service requests in order to avoid memory coherency issues. The more requests that can be buffered and seen by memory controllers, the better the page management that can be achieved.

It would be desirable to implement a request buffering scheme.

SUMMARY

The invention concerns an apparatus comprising a plurality of page circuits and a common request circuit. The page circuits may each be implemented within a respective memory bank controller of a memory bank set and be configured to store an address and determine a page hit status. The common request circuit may be implemented within the memory bank set and be configured to store client requests and issue a command corresponding to the client requests in response to the page hit status and an order of storage of the client requests. The page circuits may comprise half a storage depth of the common request circuit. The common request circuit may be shared between each of the memory bank controllers of the memory bank set. The memory bank controllers may be configured to control access to a random access memory. The common request circuit and the page circuits may be configured to provide a buffering scheme based on the address, the client requests and the page hit status that may enable the common request circuit to preview upcoming client requests to the random access memory.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing a request buffering scheme that may (i) enable each memory bank controller to preview requests without being blocked by other requests in the pipeline, (ii) share a request queue between multiple memory bank controllers, (iii) implement one page queue circuit in each memory bank circuit, (iv) implement multiple bank sets per memory die each comprising a request queue and multiple page queues, (v) implement a page queue with half the storage depth of the request queue, (vi) enable aggressive page management for a random access memory by opening and closing pages appropriately, (vii) enable client requests to be serviced in order, (viii) be implemented in memory controllers for LPDDR4 and LPDDR5 memory and/or (ix) be implemented as one or more integrated circuits.

Embodiments of the present invention may be configured to implement a client requests buffering scheme to enable efficient memory access for a random access memory. The client requests buffering scheme may be implemented per memory bank. The client requests buffering scheme may be configured to enable each memory bank to preview future (e.g., upcoming) client requests without getting blocked by other client requests in a pipeline. The client request buffering scheme may enable data transfers from past requests to continue to be performed, while doing efficient page management for the future requests. The client requests buffering scheme may be configured by implementing a buffer structure that limits an amount of buffering (e.g., buffering as little data as possible while still providing the preview of upcoming client requests).

Embodiments of the present invention may comprise a common request circuit. The common request circuit may implement a data queue. The common request circuit may be a common request queue (e.g., RQUE). The common request circuit may be shared by multiple memory bank controllers for a random access memory.

Embodiments of the present invention may comprise multiple page circuits. The page circuits may each implement a data queue. The page circuits may each be a page queue (e.g., PQUE). There may be one page circuit implemented per memory bank controller for a random access memory.

The page circuits may each be implemented with a storage depth of half the size of a storage depth of the common request circuit. Implementing the page circuits at half the storage depth of the common request circuit may limit a storage space area for the client requests buffering scheme without loss of performance (e.g., provide a balance between area and timing). Implementing the common request circuit and multiple page circuits may enable aggressive page management (e.g., enabling opening and closing of pages of a random access memory appropriately and/or efficiently).

Figure 1:
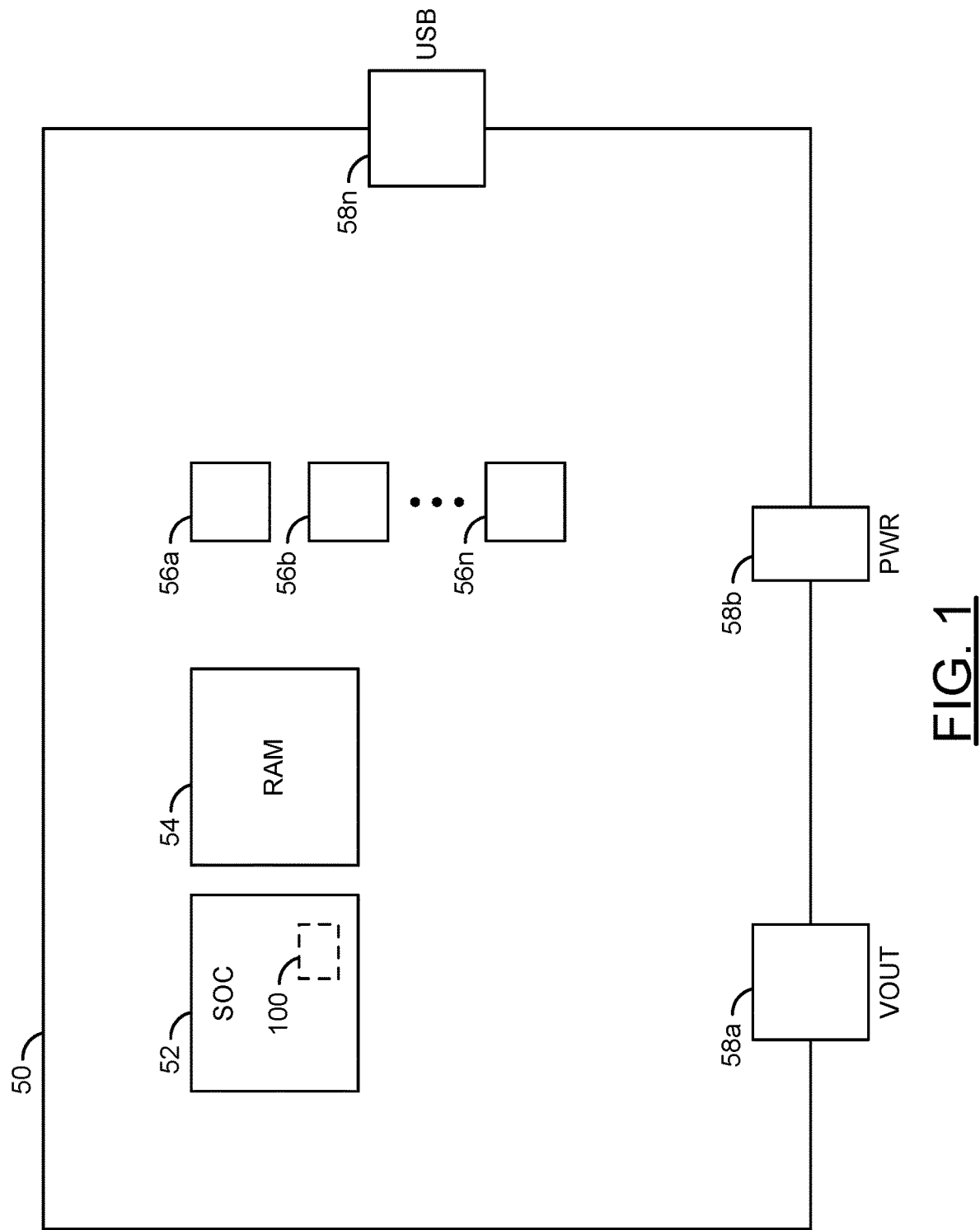
FIG. 1 is a diagram illustrating a context of an example embodiment of the present invention.

Referring to FIG. 1, a diagram illustrating a context of an example embodiment of the present invention is shown. A circuit 50 is shown. The circuit 50 may implement a computing device. In one example, the computing device 50 may be a computer motherboard (e.g., an ATX motherboard, a mATX motherboard, a laptop motherboard, etc.). In another example, the computing device 50 may be a portable device (e.g., a main board for a smartphone, a main board for a tablet computing device, a motherboard for a Raspberry Pi computing device, etc.). In yet another example, the computing device 50 may be a main board for application-specific devices (e.g., a digital camera). The types of computing devices may be varied according to the design criteria of a particular implementation.

The circuit 50 may comprise a block (or circuit) 52, a block (or circuit) 54, blocks (or circuits) 56a-56n and/or blocks (or circuits) 58a-58n. The circuit 52 may implement a processor. The circuit 54 may implement a memory. The circuits 56a-56n may implement various modules. The circuits 58a-58n may implement various input/output controllers. The circuit 50 may comprise other components (not shown). The number, type and/or arrangement of the components of the circuit 50 may be varied according to the design criteria of a particular implementation.

The processor 52 may be configured to execute computer readable instructions. The processor 52 may be configured to receive input, perform various operations on the input received and generate output and/or update internal registers in response to the operations performed. The processor 52 may be configured to access the memory 54. For example, the processor 52 may be configured to receive input from the memory 54 and write output to the memory 54.

The processor 52 is shown comprising a block (or circuit) 100. The circuit 100 may be a module configured to implement the client requests buffering scheme. The client requests buffering scheme implemented by the circuit 100 may be configured to enable efficient memory access by the processor 52 to/from the memory 54. In an example, the circuit 100 may be a component of a memory controller of the processor 52.

In the example shown, the processor 52 may be a system-on-chip (SoC). In one example, the processor 52 may be an ARM-based processor. In another example, the processor 52 may implement an x86 (or x86-64) architecture. In yet another example, the processor 52 may implement a RISC architecture. Generally, the processor 52 may be any type of processor that uses an external dynamic random access memory chip and/or module. The type of the processor 52 implementing the client request buffering scheme of the circuit 100 may be varied according to the design criteria of a particular implementation.

The memory 54 may implement a random access memory (RAM). The memory 54 may be a high speed and high density memory. The memory 54 may be accessed by the processor 52. The memory 54 may provide an external memory for the processor 52.

In one example, the memory 54 may implement a Low-Power Double Data Rate, generation 5 (LPDDR5) memory. In another example, the memory 54 may implement a Low-Power Double Data Rate, generation 4 (LPDDR4) memory. In the example shown, the memory 54 may be an embedded component on the circuit 50. In some embodiments, the memory 54 may implement a Double Data Rate 5 Synchronous Dynamic Random-Access Memory (DDR5 SDRAM) (or earlier or later generation). In some embodiments, the memory 54 may be implemented as a DIMM or SODIMM. In an example, the memory 54 may be removable and/or enable adding increased capacity. Generally, the memory 54 may comprise any type of memory configured with a memory bank and pages structure. The type, format, speed, bandwidth and/or specification of the memory 54 may be varied according to the design criteria of a particular implementation.

The modules 56a-56n may implement various components of the circuit 50. In an example, the modules 56a-56n may comprise an audio controller, a video controller, a wireless controller, sensors, etc. In some embodiments, data generated by the modules 56a-56n may be presented to the processor 52 and stored in the memory 54. In one example, one or more of the modules 56a-56n may provide client requests to the processor 52 for accessing the memory 54.

The input/output (I/O) controllers 58a-58n may be configured to connect to various devices. In the example shown, the I/O controller 58a may generate a signal (e.g., VOUT), the I/O controller 58b may receive a power input (e.g., a power supply) and the I/O controller 58n may implement a USB controller. The I/O controllers 58a-58n may be configured to implement various protocols for communicating with external devices. In one example, data generated by the processor 52 in response to accessing the memory 54 may be communicated to external devices using the I/O controllers 58a-58n. In another example, data received by the I/O controllers 58a-58n may be presented to the processor 52 to be stored in the memory 54. In some embodiments, the I/O controllers 58a-58n may be configured to generate client requests to the processor 52 for accessing the memory 54.

Figure 2:
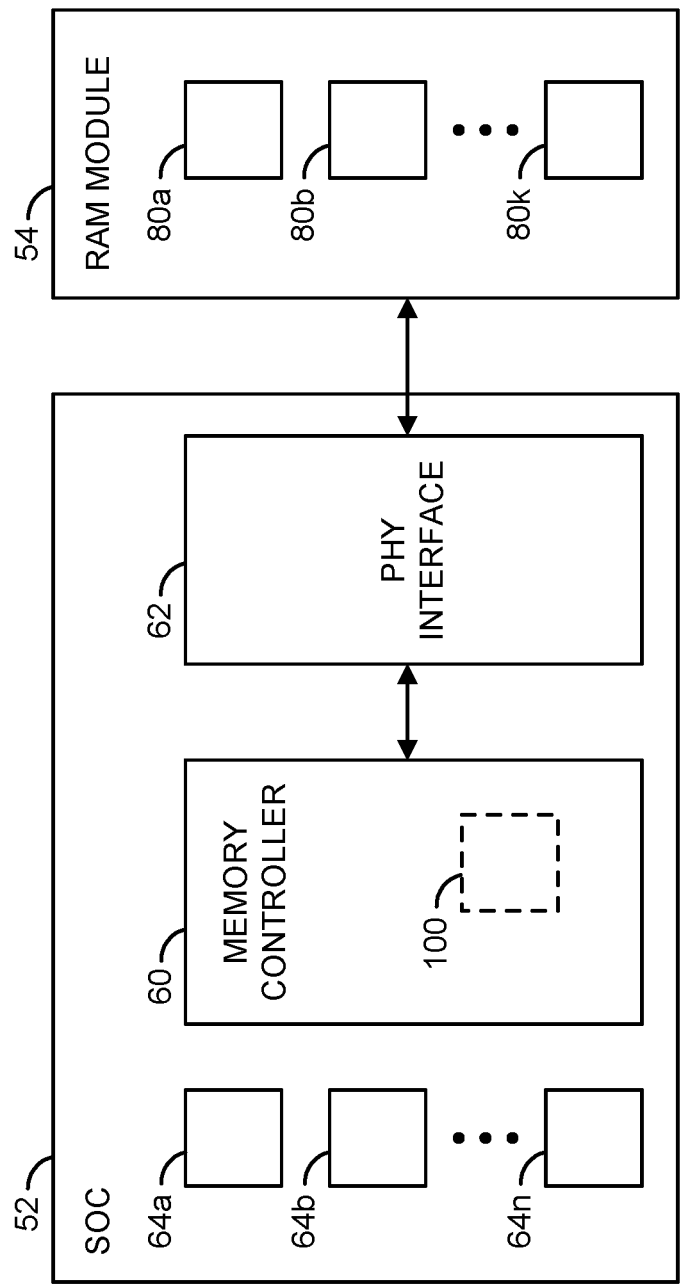
FIG. 2 is a diagram illustrating an example embodiment of the present invention implemented as part of a system-on-chip (SoC) connected to a memory.

Referring to FIG. 2, a diagram illustrating an example embodiment of the present invention implemented as part of a system-on-chip (SoC) connected to a memory is shown. The SoC 52 is shown connected to the memory 54. The SoC 52 may be configured to access (e.g., write to, read from) the memory 54.

The SoC 52 may comprise a block (or circuit) 60, a block (or circuit) 62 and/or blocks (or circuits) 64a-64n. The circuit 60 may implement a memory controller. The circuit 62 may implement a physical interface. The circuits 64a-64n may implement various modules. The SoC 52 may comprise other components (not shown). The number, type and/or arrangement of the components of the SoC 52 may be varied according to the design criteria of a particular implementation.

The memory controller 60 may be configured to manage data written to and data read from the memory 54. The memory controller 60 may be configured to select row and column data addresses of the memory 54, control the opening and closing of pages of the memory 54 and/or operate in compliance with a specification of the type of memory implemented by the memory 54. The memory controller 60 is shown connected to the physical interface 62. The memory controller 60 may implement the circuit 100. The memory controller 60 may utilize the circuit 100 to perform the client requests buffering scheme.

The physical interface 62 may be configured to enable communication between the SoC 52 and the memory 54. The physical interface 62 may be configured to perform low level signaling to the memory 54. In an example, the physical interface 62 may implement a DFI specification. In an example, the memory controller 60 may be configured to convert a physical address and forward an address field to the physical interface 62. The address fields may be inputs to the multiplexer circuit of the physical interface 62. A demultiplexer on the memory 54 may use the converted inputs to select the corresponding memory location and return the data, which is then passed back through the multiplexer of the physical interface 62 to consolidate the data in order to reduce the required bus width for the operation.

The modules 64a-64n may implement various functionality of the SoC 52. In one example, one or more of the modules 64a-64n may implement registers. In another example, one or more of the modules 64a-64n may implement user logic. The types of modules 64a-64n implemented by the SoC may be varied according to the design criteria of a particular implementation.

The memory 54 may comprise blocks (or circuits) 80a-80n. The blocks 80a-80n may represent memory dies. The memory dies 80a-80n may be one component of the memory hierarchy of the memory 54. The memory dies 80a-80n may be one type of logical unit (or storage unit) of the memory 54. Each of the memory dies 80a-80n may share address lines and/or data lines but may be read from or written to based on a chip select value. The memory 54 may comprise other components (not shown). The capacity and/or process size of each of the memory dies 80a-80n may be varied according to the design criteria of a particular implementation.

Figure 3:
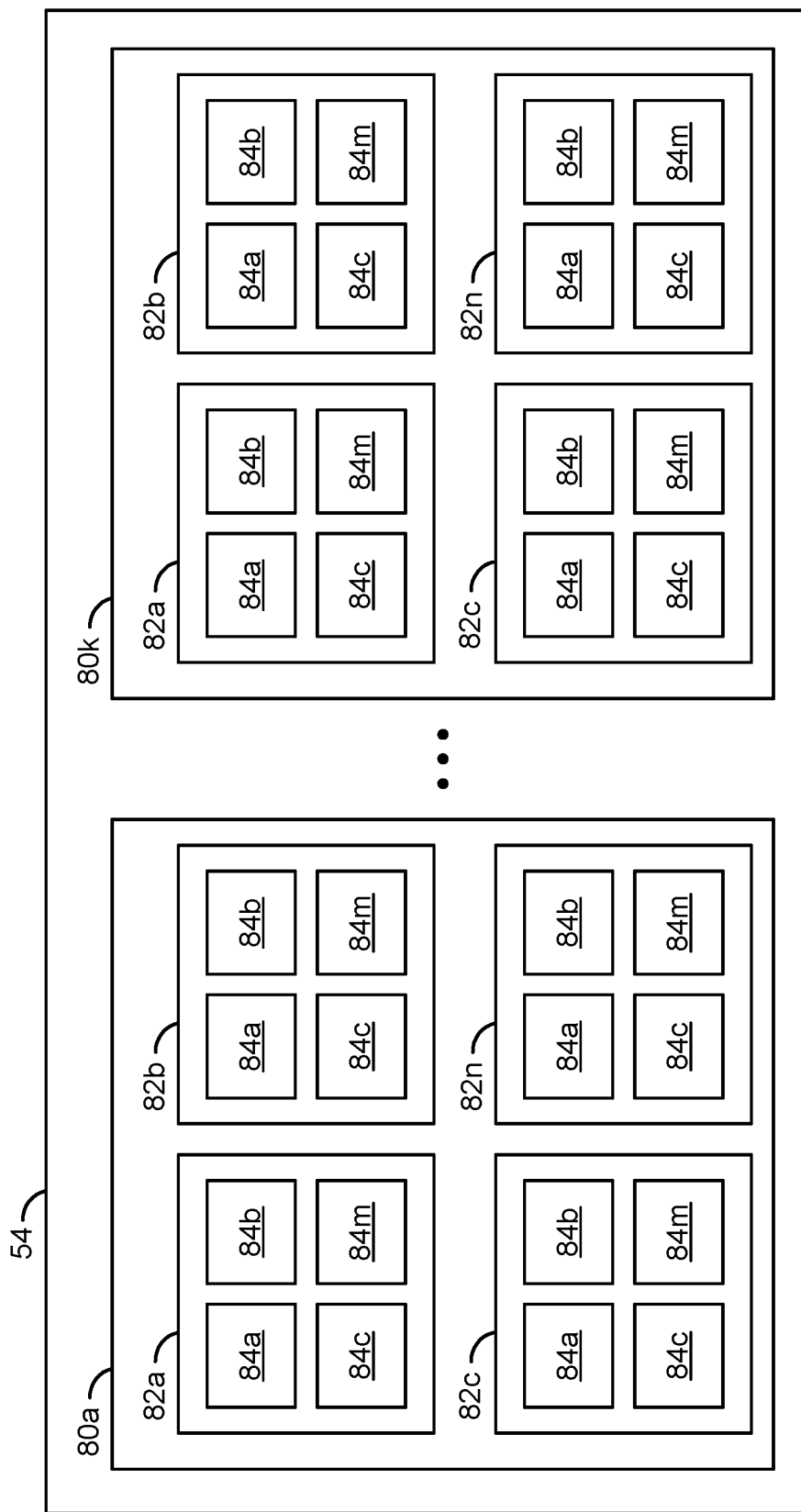
FIG. 3 is a diagram illustrating an example structure of a random access memory that may be accessed using the request buffering scheme.

Referring to FIG. 3, a diagram illustrating an example structure of a random access memory that may be accessed using the request buffering scheme is shown. A structure of the memory 54 is shown as an illustrative example. The structure shown may be one example DRAM configuration that may be compatible with the client requests buffering scheme implemented by the circuit 100.

The memory 54 is shown comprising the memory dies 80a-80k. Each of the memory dies 80a-80k may comprise blocks (or circuits) 82a-82n. The blocks 82a-82n may implement bank sets. Each of the bank sets 82a-82n may comprise blocks (or circuits) 84a-84m. The blocks 84a-84m may comprise memory banks. The memory banks 84a-84m may comprise a set of rows and columns of data storage units.

In the example shown, each of the memory dies 80a-80k may comprise four of the bank sets 82a-82n (e.g., a memory group). In the example shown, each of the bank sets 82a-82n may comprise four of the memory banks 84a-84m. In the example shown, each of the memory dies 80a-80k may comprise 16 of the memory banks 84a-84m. In some embodiments, the memory dies 80a-80k may have other DRAM configurations (e.g., 2 banks, 8 banks, etc.). The number of bank sets 82a-82n and/or the number of memory banks 84a-84m per each of the bank sets 82a-82n may be varied according to the design criteria of a particular implementation.

Generally, multiple of the memory banks 84a-84m may be active at any one time. However, only one of the memory banks 84a-84m may be carrying out a data transfer at any one time. A page may be a unique address made up of one of the bank sets 82a-82n, one of the memory banks 84a-84m and a row address. Each of the banks 84a-84m may have one active page at any given time. The circuit 100 may be configured to operate with any type of random access memory with a banks and page structure.

The memory controller 60 may be configured to efficiently schedule operations of the memory 54 to reduce latency and/or to utilize low power modes of the memory 54 when possible. The memory controller 60 may be configured to implement a page policy to determine when to close pages in the memory 54. The circuit 100 may enable the page policy implemented by the memory controller 60 to effectively limit power consumption while enabling high bandwidth performance.

Generally, when the processor 52 needs access to data in the memory 54, the processor 52 may issue a request to the memory controller 60 (e.g., a client request). The memory controller 60 may determine an appropriate sequence and timing of DRAM commands to fulfill the client request. For example, to access data in the memory 54, the memory controller 60 may determine whether a desired one of the memory dies 80a-80k has a clock enabled, check a state of the desired one of the memory banks 84a-84m, check if which row is active, determine if the active row is the same as the desired row, close a row (if necessary) and/or issue read/write commands.

A page-hit may be when a read or write (e.g., a client request) is issued by the memory controller 60 to a currently open page of one of the memory banks 84a-84m. If a page is currently open and the client request is for access to another page, then there may be a page miss. A page miss may result in a bandwidth loss. The circuit 100 may be configured to implement the client requests buffering scheme to limit an amount of bandwidth loss when a page miss occurs by providing a preview of other upcoming operations.

Figure 4:
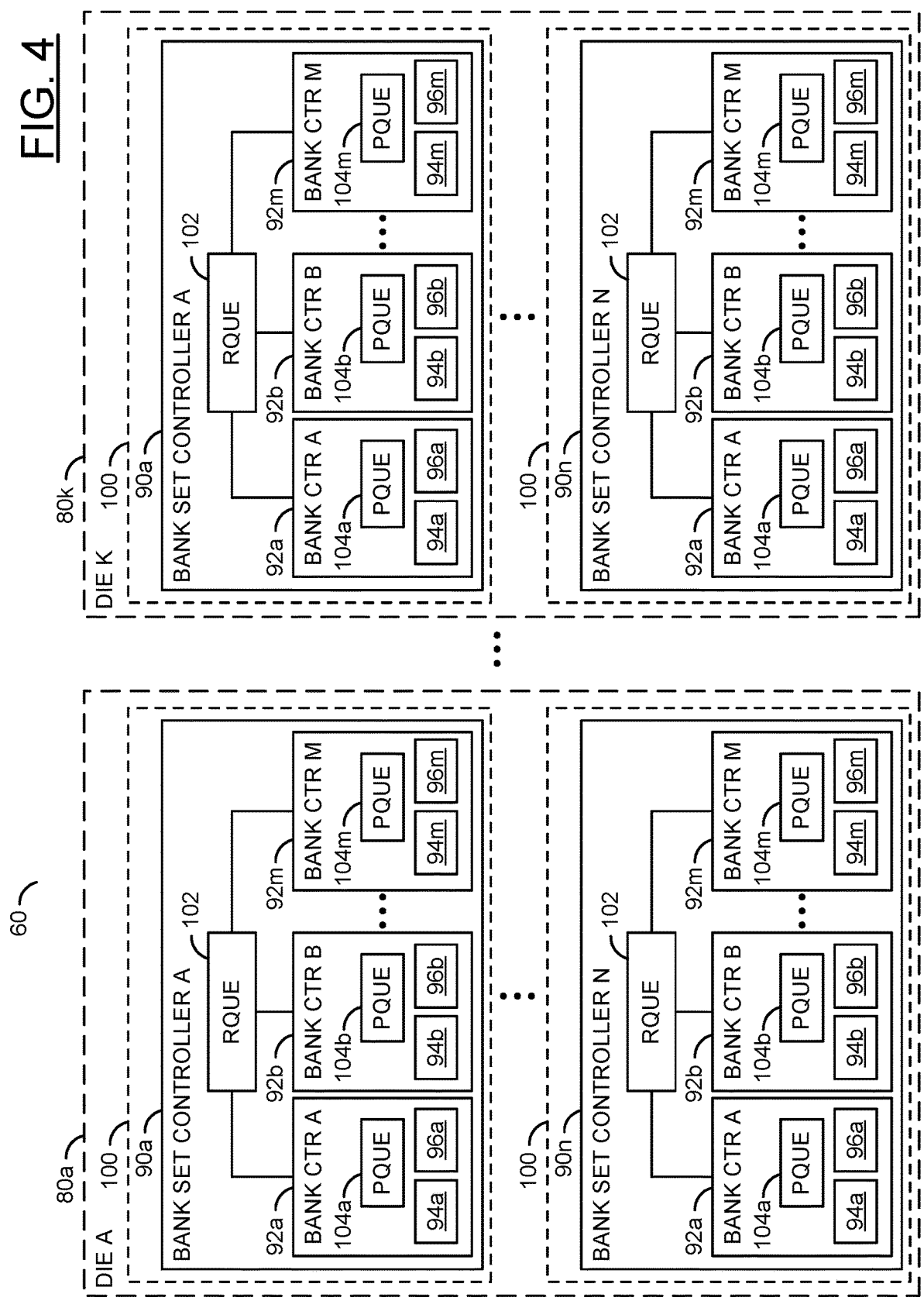
FIG. 4 is a block diagram illustrating common request circuits and multiple page circuits in a bank set controller.

Referring to FIG. 4, a block diagram illustrating common request circuits and multiple page circuits in a bank set controller is shown. An example embodiment of the apparatus 100 is shown as a portion of the memory controller 60. The apparatus 100 and the memory controller 60 are shown with respect to the memory dies 80a-80k. While the memory dies 80a-80k are shown for reference, the memory dies 80a-80k may not be implemented as part of the memory controller 60. The memory dies 80a-80k are illustrated to represent how the memory controller 60 and/or the apparatus 100 interacts with the memory dies 80a-80k.

The memory controller 60 may comprise multiple implementations of the apparatus 100. Each implementation of the apparatus 100 may comprise one of a number of blocks (or circuits) 90a-90n implemented by the memory controller 60.

The blocks 90a-90n may each implement a bank set controller. The bank set controllers 90a-90n may correspond to the bank sets 82a-82n for each of the memory dies 80a-80k. For example, the memory controller 60 may implement the bank set controllers 90a-90n for each of the memory dies 80a-80k.

The bank set controller 90a-90n may be configured to manage memory access to the corresponding bank sets 82a-82n shown in association with FIG. 3. For example, N of the bank set controllers 90a-90n may be implemented for the N bank sets 82a-82n implemented on one of the dies 80a-80k. In an example, for K of the memory dies 80a-80k that each implement N of the memory bank sets 82a-82n, the memory controller 60 may implement K*N of the bank set controllers 90a-90n.

Each of the bank set controllers 90a-90n may comprise a block (or circuit) 102 and/or a number of blocks (or circuits) 92a-92m. The circuit 102 may implement a common request circuit. Each of the circuits 92a-92m may comprise bank controllers. The bank set controllers 90a-90n may comprise other components (not shown). The number, type and/or arrangement of the components of each of the bank set controllers 90a-90n may be varied according to the design criteria of a particular implementation.

The common request circuit 102 may be configured as a common request queue (e.g., RQUE). The common request circuit 102 may implement a first-in-first-out buffer. The common request circuit 102 may be implemented within each of the bank set controllers 90a-90n. The common request circuit 102 may be shared by each of the bank controllers 92a-92m within one of the bank set controllers 90a-90n (e.g., each implementation of the apparatus 100 may comprise one implementation of the common request circuit 102). In example shown, there may be M bank controllers 92a-92m within each of the bank set controllers 90a-90n. The common request circuit 102 may be shared by M of the bank controllers 92a-92m.

The bank controllers 92a-92m may each be configured to manage memory access to corresponding memory banks 84a-84m. In an example, the bank controller 92a of the bank set controller 90a of the memory die 80a may manage memory access to the memory bank 84a of the bank set 82a of the memory die 80a, the bank controller 92b of the bank set controller 90a of the memory die 80a may manage access to the memory bank 84b of the bank set 82a of the memory die 80a, the bank controller 92a of the bank set controller 90b of the memory die 80b may manage memory access to the memory bank 84a of the bank set 82b of the memory die 80b, etc. The number of memory bank controllers 92a-92m implemented within each of the bank set controllers 90a-90n may correspond to the number of memory banks 84a-84m implemented within a corresponding one of the memory bank sets 82a-82n. In the example shown, each of the memory dies 80a-80k may implement M of the memory banks 84a-84m within each of the bank sets 82a-82n and the memory controller 60 may implement M of the memory bank controllers 92a-92m within each of the bank set controllers 90a-90n.

Each of the bank set controllers 92a-92m may comprise a corresponding one of the blocks (or circuits) 94a-94m, a corresponding one of the blocks (or circuits) 96a-96m and/or a corresponding one of the blocks (or circuits) 104a-104m. The circuits 94a-94m may each implement bank control logic. The circuits 96a-96m may each implement one or more page info registers. The circuits 104a-104m may each implement a page circuit. Each of the bank controllers 92a-92m may comprise other components (not shown). The number, type and/or arrangement of the components of the bank controllers 92a-92m may be varied according to the design criteria of a particular implementation.

The bank control logic 94a-94m may comprise various circuitry (e.g., logic gates, registers, multiplexers, etc.). The bank control logic 94a-94m may be configured to control access to the memory banks 84a-84m. Generally, the bank control logic 94a-94m from one of the bank controllers 92a-92m may operate independent from the bank control logic 94a-94m from another one of the bank controllers 92a-92m.

The page info registers 96a-96m may be configured to store data that indicates whether pages in the memory banks 84a-84m are opened or closed (e.g., the page status). The page info registers 96a-96m may provide the page status for each page within the corresponding one of the memory banks 84a-84m controlled by the respective bank controllers 92a-92m. The page info registers 96a-96m may indicate the page status by storing a valid bit and a page ID (e.g., {valid, page_id}).

Each of the memory banks 84a-84m may comprise multiple pages. The page ID value stored in the page info registers 96a-96m may provide a reference to a particular page within the corresponding one of the memory banks 84a-84m. The valid value stored in the page info registers 96a-96m may indicate whether a particular one of the pages is open or closed. In one example, the valid value may be represented by a bit flag. Whether a value of '1' (or logical high) or a value of '0' (or logical low) indicates that a page is opened or closed may be varied according to the design criteria of a particular implementation.

The page circuits 104a-104m may be configured as a page queue (e.g., PQUE). The page circuits 104a-104m may each implement a first-in-first-out buffer. Each of the page circuits 104a-104m may be implemented with half the storage depth of the common request circuit 102. One of the page circuits 104a-104m may be implemented within each of the bank controllers 92a-92m. Each of the page circuits 104a-104m may operate independently from each other for one of the bank controllers 92a-92m within one of the bank set controllers 90a-90n. In the example shown, since there are M bank controllers 92a-92m within each of the bank set controllers 90a-90n, M of the page circuits 104a-104m may be implemented within each of the bank set controllers 90a-90n.

The common request circuit 102 may be shared by the multiple page circuits 104a-104m. The combination of the common request circuit 102 and the page circuits 104a-104m may be the circuit 100 (e.g., one circuit 100 per bank set). In an example, N*M of the page circuits 104a-104m may be implemented for each of the memory dies 80a-80k, where M is the number of the bank controllers 92a-92m implemented per bank set and N is the number of bank set controllers 90a-90n implemented per memory die.

Implementing one of the common request circuits 102 as a shared first-in-first-out queue in each of the bank set controllers 90a-90n may provide a timing-area balance. The common request circuit 102 may be configured to store the client requests generated by the processor 52. The client requests stored by the common request circuit 102 may be popped off the queue when a command (e.g., a column address strobe (CAS) command) has been performed by the back end logic 110. The client requests stored by the common request circuit 102 may comprise information configured to enable memory access. For example, the information in the client request may comprise an address (e.g., a bank, a row, a column, etc.) and/or an access category (e.g., read, write, masked-write, etc.).

The client request stored in a top element of the queue of the common request circuit 102 (e.g., the first out element), may be serviced in response to the common request circuit 102 checking one of the page info registers 96a-96m and the client request stored in a second element (e.g., the subsequent element) of the queue. In one example, the common request circuit 102 may serve the client request stored in the top element by issuing an activate (e.g., ACT) command if the page corresponding to the address of the client request is closed. In another example, the common request circuit 102 may serve the client request stored in the top element by issuing the CAS command if the page corresponding to the address of the client request is already open (e.g., a page hit is detected by the corresponding one of the page info registers 96a-96m). In yet another example, the common request circuit 102 may serve the client request stored in the top element by issuing the CAS command with an automatic precharge (e.g., a CAS-AP command), if there is a page miss detected between the second element and the top element in the common request circuit 102.

The commands in the common request circuit 102 may be serviced in order (e.g., the first-in first-out order). Implementing the single shared common request circuit 102 alone for each of the memory banks 92a-92m (e.g., without the page circuits 104a-104m) may be too restrictive to enable the client requests to be serviced in order. Implementing one of the common request circuits 102 for each of the bank controllers 92a-92m (e.g., instead of the page circuits 104a-104m) may significantly increase the area of the circuit 100 due to the number of the memory banks 84a-84m. For example, there may be 16 of the memory banks 84a-84m per each of the memory dies 80a-80k in LPDDR5 memory. Implementing the page circuits 104a-104m instead of multiple common response circuits 102 for each of the bank controllers 92a-92m may provide a balance between area and timing. The circuit 100 may provide the common request circuit 102 shared across multiple of the memory bank controllers 92a-92m and the page circuits 104a-104m implementing another queue per memory bank. The page circuits 104a-104m may be implemented with half the size of the common request circuit 102. Implementing the common request circuit 102 with twice the size of each of the page circuits 104a-104m may provide memory management that may be as effective as page management if an independent one of the common request circuits 102 were implemented per memory bank 84a-84m but consume less storage area compared to implementing one of the common request circuits 102 per each of the memory bank controllers 92a-92m.

The page circuits 104a-104m may each implement one first-in-first-out queue for each of the memory banks 84a-84m. Each of the page circuits 104a-104m may be implemented with half of the storage depth of the common request circuit 102. Each of the page circuits 104a-104m may be configured to store an address. The address stored by each of the page circuits 104a-104m may be row addresses. Storing only the row addresses may enable the page circuits 104a-104m to use less area (e.g., compared to implementing multiple common request circuits 102 per memory bank). The row addresses for the potential commands may be pushed into the page circuits 104a-104m whenever a bank switch occurs.

The page circuits 104a-104m may be configured to access the respective one of the page info registers 96a-96m to determine whether the row address stored in the top element (e.g., the first out element) has a hit or miss (e.g., determine whether the corresponding page is already the open page). The corresponding one of the bank controllers 92a-92m may issue the activate command to open the row address stored in the top element of the page circuits 104a-104m. The activate command (ACT) may be configured to open a row in a bank to make the row accessible for subsequent write (WR) and read (RD) operations. The activate (ACT) command may be configured to select the bank, bank group, and row to be activated. The corresponding one of the bank controllers 92a-92m may issue the precharge command (e.g., PCHG) if the row address stored in the top element of the page circuits 104a-104m has a page miss. The precharge (PRE) command may be configured to de-activate a currently open row. Since only one row may be opened at a time, the precharge command may be issued before the activate command may be issued for opening a different row.

Figure 5:
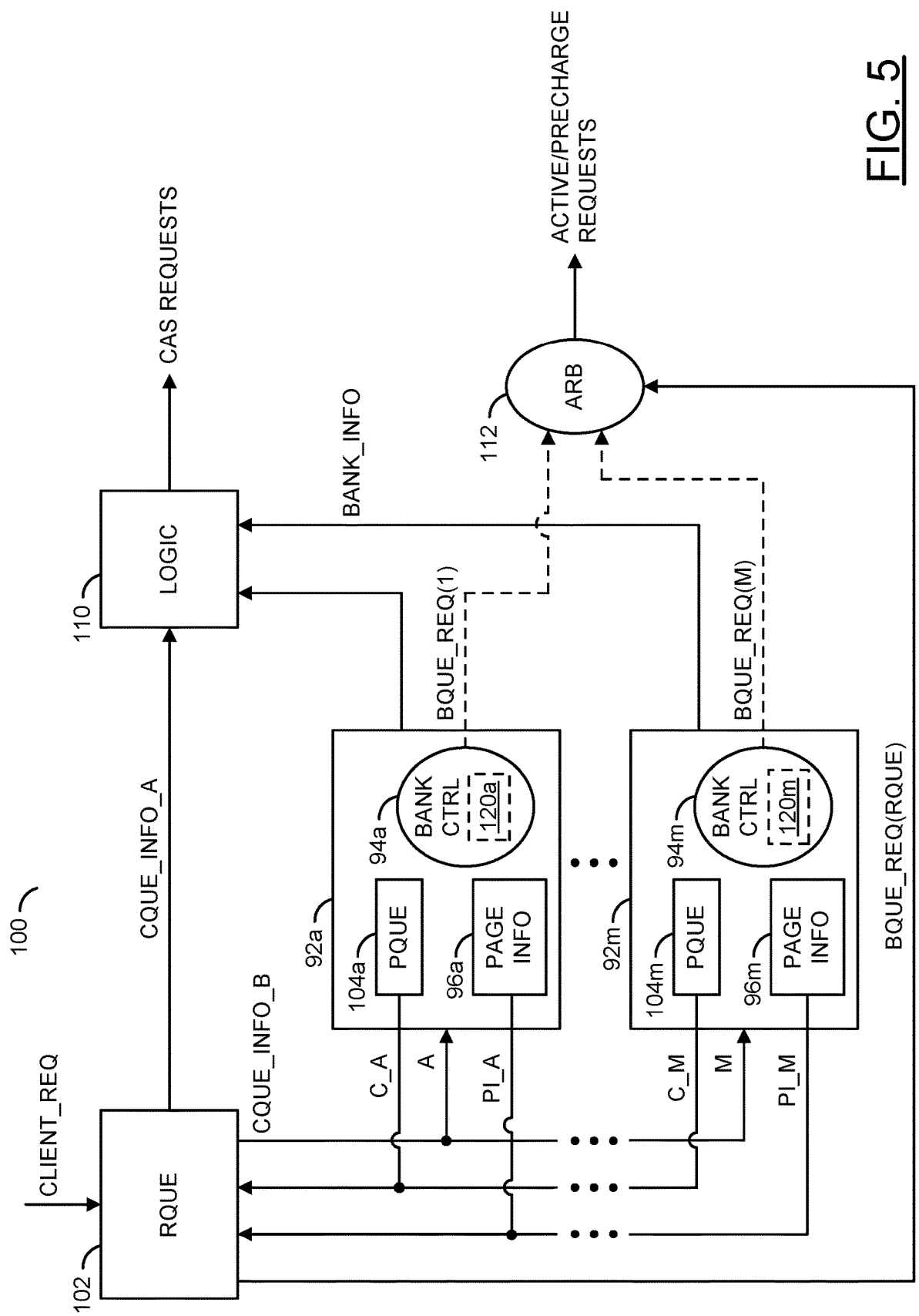
FIG. 5 is a block diagram illustrating an example embodiment of the present invention.

Referring to FIG. 5, a block diagram illustrating an example embodiment of the present invention is shown. Components of the circuit 100 are shown. In the example shown, the circuit 100 implemented within one of the bank set controllers 90a-90n may be shown as an illustrative example. The circuit 100 may be a representative example of any of the circuits 100 shown in association with FIG. 4.

The circuit 100 may comprise the common request circuit 102 and one or more of the page circuits 104a-104m. The page circuits 104a-104m are shown implemented within respective bank controllers 92a-92m. The common request circuit 102 may be shared between each of the bank controllers 92a-92m. The bank control logic 94a-94m and the page info registers 96a-96m are also shown within the bank controllers 92a-92m.

The circuit 100 may further comprise a block (or circuit) 110 and/or a block (or circuit) 112. The circuit 110 may implement back end logic of the memory controller 60. The circuit 112 may comprise arbitration logic of the memory controller 60. The circuit 100 may comprise other components (not shown). The number, type and/or arrangement of the components of the circuit 100 may be varied according to the design criteria of a particular implementation.

The common request circuit 102 may be configured to generate a signal (e.g., CQUE_INFO_A), a signal (e.g., CQUE_INFO_B) and/or a signal (e.g., BQUE_REQ). The common request circuit 102 may be configured to receive a signal (e.g., CLIENT_REQ), signals (e.g., C A-C M) and/or signals (e.g., PI_A-PI_M). The signal CQUE_INFO_A may be presented to the back end logic 110. The signal CQUE_INFO_B may be presented to each of the bank controllers 92a-92m. The signal BQUE_REQ may be presented by the common request circuit 102 to the arbitration logic 112. The signal CLIENT_REQ may be client requests received from the I/O controllers 58a-58n and/or other components by the processor 52. The signals C A-C M may be received from the respective page circuits 104a-104m. The signals PI_A-PI_M may be received from the respective page info registers 96a-96m.

The bank control logic 94a-94m may each be configured to generate a signal (e.g., BANK_INFO). The signal BANK_INFO may be presented to the back end logic 110. The page circuits 104a-104m may each be configured to generate a signal (e.g., BQUE_REQ(1)-BQUE_REQ(M)). The signals BQUE_REQ(1)-BQUE_REQ (M) may be presented by one or more of the page circuits 104a-104m to the arbitration logic 112.

The back end logic 110 may be configured to generate commands in response to the client requests stored by the common request circuit 102. The commands generated by the back end logic 110 may be CAS requests. For example, the back end logic 110 may generate the CAS commands in response to the signal CQUE_INFO_A and the status information provided by the bank controllers 92a-92m (e.g., the signal BANK_INFO).

The arbitration logic 112 may be configured to allocate access to the memory 54 (e.g., the memory banks 84a-84m of one of the bank sets 82a-82n). The arbitration logic 112 may be configured to implement bank preparation for any operations intended for a closed row. The arbitration logic 112 may be configured to read or write data to open rows. The arbitration logic 112 may be configured to perform various manager operations such as memory refreshes. The arbitration logic 112 may be configured to generate active commands (ACT) or precharge commands (PCHG) in response to the signal BQUE_REQ from the page circuits 104a-104m and/or the signal BQUE_REQ from the common request circuit 102. The activate command and the precharge command may be page management commands.

Each of the page circuits 104a-104m may be configured to generate the respective signals C A-C M. The signals C A-C M may comprise feedback signals. The signals C A-C M may be presented to the common request circuit 102. The page circuits 104a-104m may present a respective one of the feedback signals C A-C M to provide an indication to the common request circuit 102 about whether or not to convert a CAS command into a CAS command with automatic precharge. In one example, converting the CAS command into a CAS command with an automatic precharge may adjust access to the memory 54 to prevent bandwidth loss during a page miss scenario.

Each of the page info registers 96a-96m may be configured to generate respective signals PI_A-PI_M. The signals PI_A-PI_M may comprise page status signals. The signals PI_A-PI_M may be presented to the common request circuit 102. The page info registers 96a-96m may present a respective one of the page status signals PI_A-PI_M to provide a page status for the corresponding one of the memory banks 84a-84m to the common request circuit 102.

The page circuits 104a-104m may be configured to determine the status of the page corresponding to a row stored in the top element in the queue. The page circuits 104a-104m may read the respective one of the page info registers 96a-96m. The page info registers 96a-96m may be read to determine whether the row address stored in the top element of the page circuits 104a-104m is a page hit or a page miss. A page hit may be when the page corresponding to the row address is the currently open page in the memory bank. A page miss may be when the page corresponding to the row address is not the currently open page in the memory bank. In one example, if there is a page hit for the top element in the page circuits 104a-104m, no page management commands may be generated by the arbitration logic 112. In another example, if there is a page miss for the top element of the page circuits 104a-104m, the arbitration logic 112 may generate the precharge command followed by the activate command. The page status may be presented to the common request circuit 102 as the signals PI_A-PI_M.

A page-hit condition may be determined based on the valid value and whether the page ID stored in one of the page info registers 96a-96m that corresponds to the top value in the common request circuit 102 matches the page value at the top of the corresponding one of the page circuits 104a-104m. In an example, the page-hit status may be determined using:

$$\text{is\_page\_hit} = (\text{valid}[Bn]\&\&(\text{page\_id}[Bn] == Pn))$$

where Bn may represent a bank number stored at the top of the common request circuit 102 and Pn may represent a page value at the top of the corresponding one of the page circuits 104a-104m.

If there is a page miss, before the desired page can be opened with the activate command, the currently opened page must first be closed with the precharge command. In response to the page hit status of the elements of the page circuits 104a-104m, the arbitration logic 112 may only issue the precharge command or the activate command (e.g., page management commands). For example, the CAS commands may not be issued in response to the status of the elements of the page circuits 104a-104m.

The arbitration logic 112 may be configured to issue the precharge command or the activate command in response to the signal BQUE_REQ generated by the common request circuit 102. For example, if the page management command fails to issue in response to the status of the page circuits 104a-104m prior to the command being at the top of the common request circuit 102, the common request circuit 102 may generate the signal BQUE_REQ to enable the arbitration circuit 112 to generate the activate command or the precharge command. Generally, the CAS requests (e.g., generated in response to the signal CQUE_INFO_A) may be communicated downstream to the back end logic 110. Any precharge or activate requests from the common request circuit 102 may go through the arbitration logic 112.

The common request circuit 102 may be configured to analyze a next one of the client requests stored in the queue and the row address stored in the top of one of the page circuits 104a-104m in order to determine whether to convert the CAS command to the CAS command with an automatic precharge. The page circuits 104a-104m may provide a preview of the page hit status for upcoming commands. If the preview indicates that there may be a page miss in the upcoming command, the common request circuit 102 may generate the signal CQUE_INFO_A indicating that the CAS command should be converted to a CAS command with an automatic precharge.

The common request circuit 102 may be configured to present information about the client requests to the page circuits 104a-104m. The information about the client requests may be presented as the signal CQUE_INFO_B. Details of the communication between the common request circuit 102 and the page circuits 104a-104m may be described in association with FIG. 6.

The page circuits 104a-104m may be configured to provide feedback to the common request circuit 102. The feedback may be configured to inform the common request circuit 102 that the top element in the page circuits 104a-104m is a page miss. The common request circuit 102 may be configured to use the page status of the top element of the page circuits 104a-104m as a preview (e.g., to peek into the next request) to determine whether the current CAS command may be converted into the CAS command with automatic precharge.

The page circuits 104a-104m may store the page address (e.g., row address). The page address stored by the page circuits 104a-104m and the client requests stored by the common request circuit 102 may buffer upcoming client requests. The client requests may be buffered by sharing data about the upcoming client requests between the common request circuit 102 and the page circuits 104a-104m. For example, data about bank switches may be shared between the common request circuit 102 and the page circuits 104a-104m by pushing the row address for a bank switch to one of the page circuits 104a-104m that corresponds to the bank that has been switched to in the latest one of the client requests.

Page management commands may be generated by the arbitration logic 112 in response to the request at the top of the queue of the page circuits 104a-104m, the bank status (e.g., a page hit or miss) and when the common request circuit 102 enables the page management commands. The common request circuit 102 may be configured to store the client requests (e.g., CLIENT_REQ). The page management commands and/or the CAS commands may be derived (e.g., by the back end logic 110 and/or the arbitration logic 112) based on the page info registers 96a-96m. The common request circuit 102 may be configured to send activate-only page management commands by checking the page status of the top client request in the queue of the common request circuit 102 if there is still a page miss.

The common request circuit 102 may be configured to store status flags (e.g., enable values) in addition to the client requests. The status flags may be configured to prevent commands being generated prematurely in response to the status of the addresses stored in the page circuits 104a-104m. The status flags may be stored by the common request circuit 102 with each of the corresponding client requests. The status flags may comprise an activation enable (e.g., ACT_EN) status flag and a remove from queue (e.g., DEQ_EN) status flag. The status flags ACT_EN and DEQ_EN may comprise one additional bit of storage each. The ACT_EN status flag may be configured to indicate to the page circuits 104a-104m and/or the arbitration logic 112 that the command corresponding to the row address stored at the top of one of the page circuits 104a-104m may be ready to be issued. The DEQ_EN status flag may be configured to indicate to the page circuits 104a-104m that the row address stored at the top of one of the page circuits 104a-104m may be popped off (e.g., move the next row address to the top of the queue).

The status flag DEQ_EN for a current (e.g., newest) entry in the common request circuit 102 may be updated in response to every memory bank switch. The status flag ACT_EN for a previous (e.g., second newest) entry in the common request circuit 102 may be updated in response to the same bank switch. In an example, the status flag DEQ_EN for the current entry may be set to a value of '1' (e.g., a logical high value) and the status flag ACT_EN for the previous entry may be set to a value of '1' (e.g., a logical high value) in response to a bank switch.

Multiple requests may be generated based on a bank status, a top entry of the common request circuit 102 and the top entry of the page circuits 104a-104m. In some embodiments, the common request circuit 102 and/or the page circuits 104a-104m may only generate commands as a response to the client request simultaneously. The client requests may be arbitrated with a highest priority given to CAS command requests and then ACT requests from the common request circuit 102. Next highest priority may be determined based on a round robin among requests in response to the page circuits 104a-104m. In some embodiments, other arbitration schemes may be implemented considering the order of requests being pushed among the page circuits 104a-104m. In one example, the arbitration may provide higher priority to the page circuit PQUE[Bn] where Bn represents the bank value stored at the top of the common request circuit 102 and then there may be a round robin among the remaining requests from the page circuit 104a-104m.

The common request circuit 102 may always generate a request (e.g., the signal CQUE_INFO_A) if the queue of the common request circuit 102 is not empty. The requests generated in response to the common requests circuit 102 may be the activate command (e.g., performed by the arbitration logic 112) or the CAS command (or CAS command with automatic precharge) depending upon a page hit or page miss. No command may be generated based on a page hit of the row address stored in the page circuits 104a-104m. The arbitration logic 112 may generate requests of type precharge and then activate (e.g., the page management commands) based on a page miss of the row address stored in the page circuits 104a-104m. The page management commands may be generated in response to the page circuits 104a-104m, only when a status flag (e.g., PQUE_REQUEST_EN) is set. The status flag PQUE_REQUEST_EN may be stored by one or more of the page circuits 104a-104m and/or the bank control logic 94a-94m. The PQUE_REQUEST_EN status flag may be set according to the logic:
    if (PQUE_IS_EMPTY && PUSH_TO_PQUE)
       PQUE_REQUEST_EN=1;
    if (PQUE_POP)
       PQUE_REQUEST_EN=0
    if (~PQUE_IS_EMPTY && RQUE.ACT_EN)
       PQUE_REQUEST_EN=1

The top entry in the page circuits 104a-104m may be popped off when the entry in the common request circuit 102 is being popped and RQUE.DEQ_EN==1.

With the help of the page circuits 104a-104m, the common request circuit 102 may be configured to convert CAS commands into CAS-AP commands. For a particular one of the memory banks 84a-84m, the row address of the next command may be viewed from the top element of the corresponding one of the page circuits 104a-104m. For example, the row address for the next command for the memory bank 84c may be previewed by the common request circuit 102 by reading the row address stored in the top element of the page circuit 104c. The common request circuit 102 may use the information from the page circuits 104a-104m to determine whether to convert the current CAS command into the CAS command with automatic precharge based on the system page policy.

Generally, in response to the page hit status of the row address stored in the top element of the page circuits 104a-104m, the arbitration logic 112 may generate no command or generate the precharge command and then the activate command. In response to the page hit status for the address stored in the common request circuit 102, the back end logic 110 may generate the CAS command or the CAS-AP command and/or the arbitration logic 112 may generate the activate command. The page management command (e.g., activate or precharge) may be selected for the top element of the page circuits 104a-104m (e.g., storing page address only) based on the status of the page status register when ACT_EN=1.

The bank controller logic 94a-94m may each comprise a respective one of the blocks (or circuits) 120a-120m. The circuits 120a-120m may implement state machines. The state machines 120a-120m may be described in more detail in association with FIG. 12. The bank controller logic 94a-94m may comprise other components (not shown).

Figure 6:
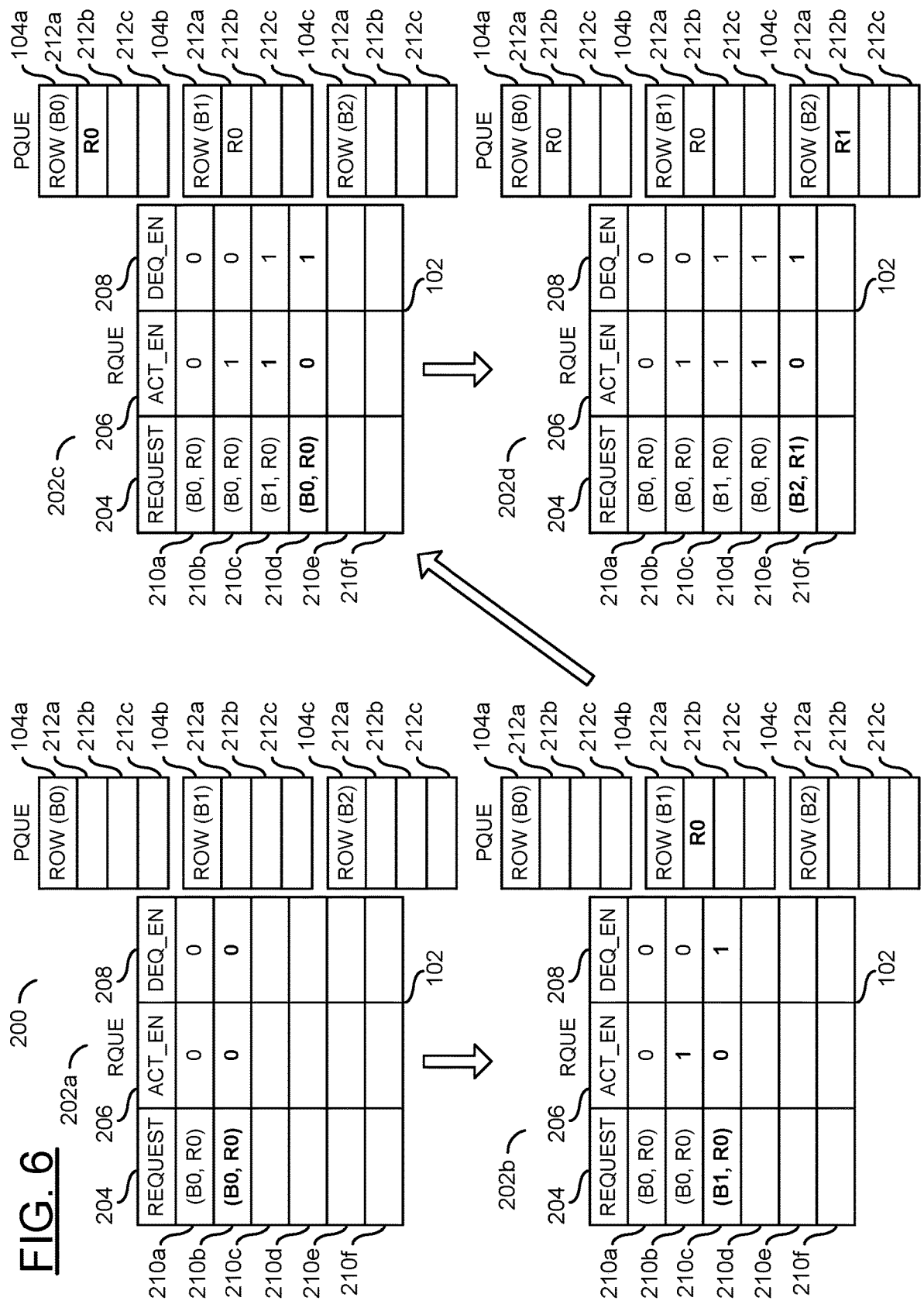
FIG. 6 is a diagram illustrating data stored for a request buffering scheme in a common request circuit and multiple page circuits.

Referring to FIG. 6, a diagram illustrating data stored for a request buffering scheme in a common request circuit and multiple page circuits is shown. A request buffering example 200 is shown. The request buffering example 200 may illustrate a bank switch concept while the common request circuit 102 (RQUE) is being enqueued.

A bank switch may occur when the client request received comprises a request for one of the memory banks 84a-84m that is different than the previously received client request. When the bank switch occurs, a page number for the enqueued client request may be pushed into the corresponding one of the page circuits 104a-104m (e.g., the respective page circuit in one of the bank controllers 92a-92m that corresponds to the same bank of the new client request). The status flag DEQ_EN for the current client request in the common request circuit 102 may be asserted in response to the bank switch. The status flag ACT_EN for the previously received client request in the common request circuit 102 may be asserted.

The request buffering example 200 may comprise a sequence of examples 202a-202d. The sequence of examples 202a-202d may illustrate the status of the common request circuit 102 and the page circuits 104a-104c after a series of client requests has been received. The common request circuit 102 and the page circuits 104a-104c shown in the sequence of examples 202a-202d may be an illustrative example of the common request circuit 102 and the page circuits 104a-104m in any one of the bank set controllers 90a-90n shown in association with FIG. 4. The sequence of examples 202a-202d may be shown in chronological order. For example, the example 202a may be the earliest example in the sequence of examples 202a-202d, then the example 202b may be shown after a next client request is received, then the example 202c may be shown after a next client request is received, and then the example 202d may be shown after a last client request is received.

The common request circuit 102 in each of the sequence of examples 202a-202d may be represented as a table of values that provides a visualization of the data stored in the common request circuit 102 in response to the client requests. The table representing the common request circuit 102 may comprise a number of columns 204-208. The column 204 may represent a request bank and request row address for the client requests. The column 206 may represent the status flag ACT_EN for the client requests. The column 208 may represent the status flag DEQ_EN for the client requests.

The table representing the common request circuit 102 may comprise a number of rows 210a-210f. Each of the rows 210a-210f may represent a client request storage location for the common request circuit 102. The rows 210a-210f may represent a depth of the common request circuit 102. Each of the rows 210a-210f may represent a storage location in the first in first out common request circuit 102 that may store a single one of the client requests. Each of the client requests may comprise the data in the columns 204-208 (e.g., the request bank and request row address, the status flag ACT_EN and the status flag DEQ_EN). In the example shown, the depth of the common request circuit 102 may be six (e.g., stores a maximum of six client requests). The depth of six is shown as an illustrative example. The depth of the common request circuit 102 may be varied according to the design criteria of a particular implementation.

The client request storage locations 210a-210f may store the client requests in a first in first out order. For example, the client request storage location 210a may store the client request that was received at the earliest time. As the client requests are popped off the common request circuit 102, the client request that was received at the next earliest time may become the top of the stack (e.g., after the client request stored in the location 210a is popped off (e.g., dequeued), the client request stored in the location 210b may be moved up to the storage location 210a).

The page circuits 104a-104c in each of the sequence of examples 202a-202d may each be represented as a table of values that provides a visualization of the data stored in the individual page circuits 104a-104c in response to the client requests. The page circuit 104a may correspond to the memory bank 84a. For example, the page circuit 104a may store values that correspond to the memory bank B0. The page circuit 104b may correspond to the memory bank 84b. For example, the page circuit 104b may store values that correspond to the memory bank B1. The page circuit 104c may correspond to the memory bank 84c. For example, the page circuit 104c may store values that correspond to the memory bank B2.

The tables representing the page circuits 104a-104c may each comprise a number of rows 212a-212c. Each of the rows 212a-212c may represent a storage location for the page circuits 104a-104c. The rows 212a-212c may represent a depth of the page circuits 104a-104c. Each of the rows 212a-212c may represent a storage location in the first in first out page circuits 104a-104c that may store a single row address representing a bank switch. In the example shown, the depth of each of the page circuits 104a-104c may be three (e.g., stores a maximum of three row addresses). The depth of three may be half of the depth of the common request circuit 102. The depth of the page circuits 104a-104c may be dependent upon the depth of the common request circuit 102.

The address locations 212a-212c may store the addresses of the bank switch in a first in first out order. For example, the address location 212a may store the address corresponding to a bank switch that occurred at the earliest time. At every bank switch, a row address may be pushed into corresponding one of the page circuits 104a-104c. For example, if the previous request was to B<0> and next request is to B<2>, the row address corresponding to current request may be pushed into the page circuit 104c (e.g., PQUE[c]). As the address locations are popped off the page circuits 104a-104c, the address location that was received at the next earliest time may become the top of the stack (e.g., after the address stored in the location 212a is popped off (e.g., dequeued), the address stored in the location 212b may be moved up to the storage location 212a).

The first example sequence 202a is shown comprising a first client request already stored in the client request location 210a. The first client request may be to (B0,R0). The common request circuit 102 may store the first client request in the first client request storage location 210a with the value B0,R0 in the column 204, the value 0 in the column 206 and the value 0 in the column 208 (e.g., RQUE[0]={B0, R0, ACT_EN=0; DEQ_EN=0}).

In the first example sequence 202a, the new client request may be to (B0, R0). The common request circuit 102 may store the new client request in the second client request storage location 210b. The new (e.g., second) client request may be the same row and bank as the previously stored client request 210a. Since there has been no bank switch, the new client request may be stored in the second client request storage location 210b with the value B0,R0 in the column 204, the value 0 in the column 206 and the value 0 in the column 208 (e.g., RQUE[1]={B0, R0, ACT_EN=0; DEQ_EN=0}) and the first client request storage location 210a may be unchanged. Since there has been no bank switch, no value may be pushed into the page circuits 104a-104c.

In the second example sequence 202b, the new client request may be to (B1, R0). The common request circuit 102 may store the new client request in the third client request storage location 210c. The new (e.g., third) client request may be the same row and a different bank as the previously stored client request 210b. Since there has been a bank switch, the new client request may be stored in the third client request storage location 210c with the value B1,R0 in the column 204, the value 0 in the column 206 and the value 1 in the column 208 (e.g., RQUE[2]={B1, R0, ACT_EN=0; DEQ_EN=1}) and the first client request storage location 210a may be unchanged (e.g., since the first client request storage location 210a is not the immediately preceding storage location to the latest client request). Since there has been a bank switch, the status flag ACT_EN in the column 206 for the previous client request may be changed and the second client request storage location 210b may be changed (e.g., RQUE[1]={B0, R0, ACT_EN=1; DEQ_EN=0}) and the row address may be pushed into the page circuit 104b that corresponds to the new bank B1. Since the third client request is the first bank switch stored for the page circuit 104b, the row address R0 may be stored in the first row address location 212a (e.g., PQUE[B1] [0]=R0).

In the third example sequence 202c, the new client request may be to (B0, R0). The common request circuit 102 may store the new client request in the fourth client request storage location 210d. The new (e.g., fourth) client request may be the same row and a different bank as the previously stored client request 210c. Since there has been a bank switch, the new client request may be stored in the fourth client request storage location 210d with the value B0,R0 in the column 204, the value 0 in the column 206 and the value 1 in the column 208 (e.g., RQUE[3]={B0, R0, ACT_EN=0; DEQ_EN=1}) and the first and second client request storage locations 210a-210b may be unchanged (e.g., since the first and second client request storage locations 210a-210b are not the immediately preceding storage location to the latest client request). Since there has been a bank switch, the status flag ACT_EN in the column 206 for the previous client request may be changed and the third client request storage location 210c may be changed (e.g., RQUE[2]={B1, R0, ACT_EN=1; DEQ_EN=1}) and the row address may be pushed into the page circuit 104a that corresponds to the new bank B0. Since the fourth client request is the first bank switch stored for the page circuit 104a, the row address R0 may be stored in the first row address location 212a (e.g., PQUE[B0] [0]=R0). Since each client request may only comprise one bank switch, the page circuit 104b may remain unchanged (e.g., PQUE[B1] [0]=R0).

In the fourth example sequence 202d, the new client request may be to (B2, R1). The common request circuit 102 may store the new client request in the fifth client request storage location 210e. The new (e.g., fifth) client request may be a different row and a different bank as the previously stored client request 210d. Since there has been a bank switch, the new client request may be stored in the fifth client request storage location 210e with the value B2,R1 in the column 204, the value 0 in the column 206 and the value 1 in the column 208 (e.g., RQUE[4]={B2, R1, ACT_EN=0; DEQ_EN=1}) and the first, second and third client request storage locations 210a-210c may be unchanged (e.g., since the first, second and third client request storage locations 210a-210c are not the immediately preceding storage location to the latest client request). Since there has been a bank switch, the status flag ACT_EN in the column 206 for the previous client request may be changed and the fourth client request storage location 210d may be changed (e.g., RQUE [3]={B0, R0, ACT_EN=1; DEQ_EN=1}) and the row address may be pushed into the page circuit 104c that corresponds to the new bank B2. Since the fifth client request is the first bank switch stored for the page circuit 104c, the row address R1 may be stored in the first row address location 212a (e.g., PQUE[B2] [0]=R1). Since each client request may only comprise one bank switch, the page circuits 104a-104b may remain unchanged (e.g., PQUE[B0] [0]=R0 and PQUE[B1] [0]=R0).

If a new client request (not shown) that may be to (B1, R0) is received, the common request circuit 102 may store the new client request in the sixth client request storage location 210f. The new (e.g., sixth) client request may be a different row and a different bank as the previously stored (e.g., fifth) client request 210e. Since there has been a bank switch, the new client request may be stored in the sixth client request storage location 210f with the value B1,R0 in the column 204, the value 0 in the column 206 and the value 1 in the column 208 (e.g., RQUE[5]={B1, R0, ACT_EN=0; DEQ_EN=1}) and the first, second, third and fourth client request storage locations 210a-210d may be unchanged (e.g., since the first, second, third and fourth client request storage locations 210a-210d are not the immediately preceding storage location to the latest client request). Since there has been a bank switch, the status flag ACT_EN in the column 206 for the previous client request may be changed and the fifth client request storage location 210e may be changed (e.g., RQUE[4]={B2, R1, ACT_EN=1; DEQ_EN=1}) and the row address may be pushed into the page circuit 104b that corresponds to the new bank B1. Since the sixth client request is the second bank switch stored for the page circuit 104b, the row address R0 may be stored in the second row address location 212b (e.g., PQUE [B1] [1]=R0). Storing a new row address location may not affect the previous entry and the first row address location 212b for the page circuit 104b may be unchanged (e.g., PQUE[B1] [0]=R0). Since each client request may only comprise one bank switch, the page circuits 104a and 104c may remain unchanged (e.g., PQUE[B0] [0]=R0 and PQUE [B2] [0]=R1).

Additional requests may be handled as client requests are received. In one of the bank controller sets 90a-90n, one element in the common request circuit 102 and/or one element stored in the page circuits 104a-104m may be pooped off (e.g., dequeued) at any time. The client requests stored in the common request circuit 102 and/or the page circuits 104a-104c may be dequeued in response to commands generated that correspond to the stored client requests. One or more commands may be generated from the common request circuit 102 and/or the page circuits 104a-104m for later arbitration.

Figure 7:
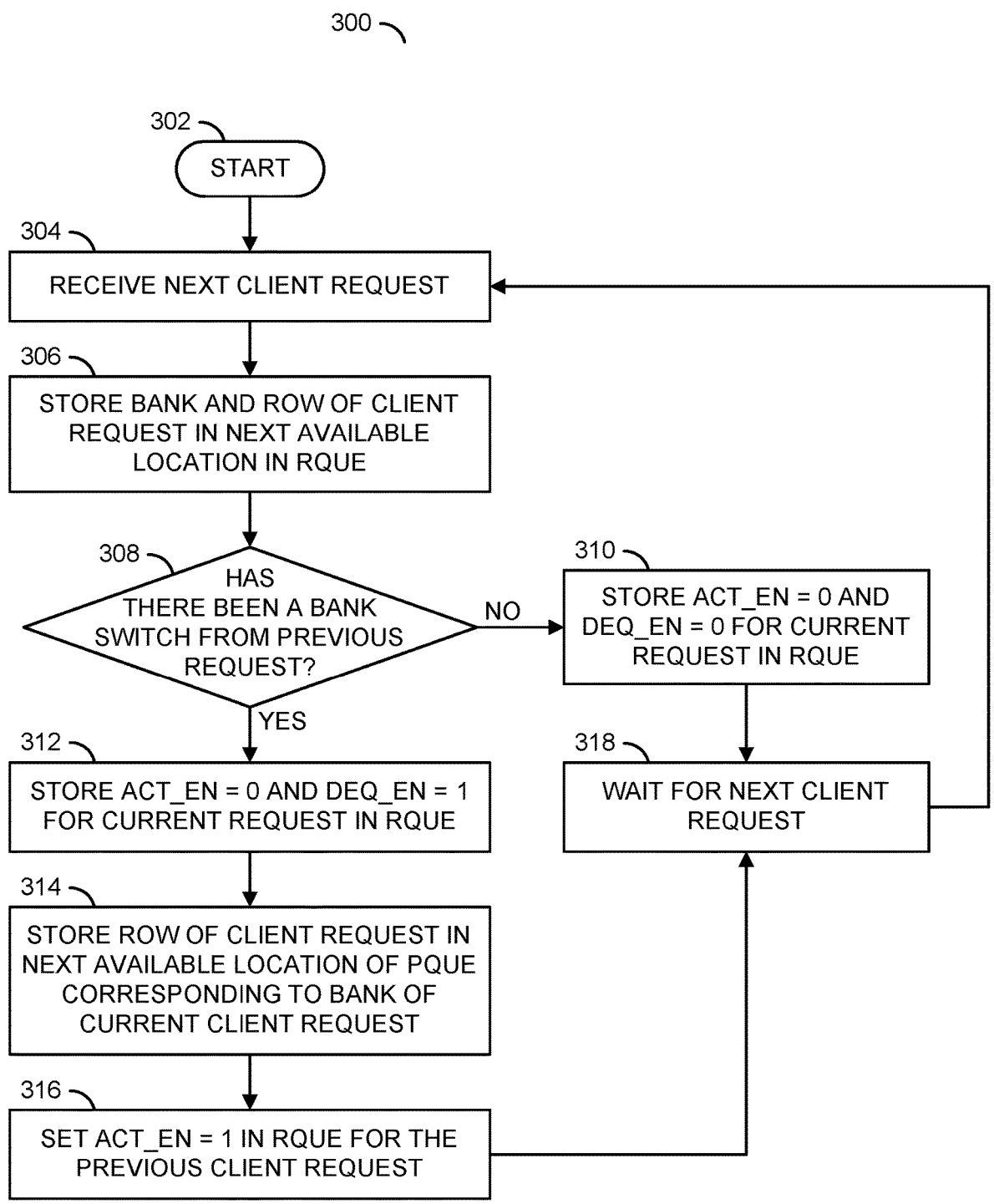
FIG. 7 is a flow diagram illustrating a method for queuing a common request circuit and/or page circuits in response to receiving client requests.

Referring to FIG. 7, a method (or process) 300 is shown. The method 300 may queue a common request circuit and/or page circuits in response to receiving client requests. The method 300 generally comprises a step (or state) 302, a step (or state) 304, a step (or state) 306, a decision step (or state) 308, a step (or state) 310, a step (or state) 312, a step (or state) 314, a step (or state) 316, and a step (or state) 318.

The step 302 may start the method 300. In the step 304, the common request circuit 102 may receive a next one of the client requests (e.g., the signal CLIENT_REQ). Next, in the step 306, the common request circuit 102 may store a bank and row of the client request in a next available location in the common request circuit 102. In an example, if the client request is the first client request received, then the bank and row information may be stored in the column 204 in the first storage location 210a. Next, the method 300 may move to the decision step 308.

In the decision step 308, the common request circuit 102 may determine whether there has been a bank switch from the previous client request. In an example, if the current client request that may be stored in the second storage location 210b is the bank B0 and the previous client request stored in the first storage location 210a is the bank B1, then the common request circuit 102 may detect a bank switch. If there is not bank switch, then the method 300 may move to the step 310. In the step 310, the common request circuit 102 may store the ACT_EN flag as a zero value and the DEQ_EN flag as a zero value for the current client request. For example, the column 206 and the column 208 may be set to zero for the current one of the storage locations 210a-210n. Next, the method 300 may move to the step 318.

In the decision step 308, if there is a bank switch, then the method 300 may move to the step 312. In the step 312, the common request circuit 102 may store the ACT_EN flag as a zero value and the DEQ_EN flag as a logical one value for the current client request. For example, the column 206 may be set to zero and the column 208 may be set to one for the current one of the storage locations 210a-210n. Next, in the step 314, the row value of the client request may be stored in a next available one of the address locations 212a-212n of one of the page circuits 104a-104m that corresponds to the bank of the current client request. In an example, if the bank value of the client request is B0, then the page circuit 104a may be selected. Continuing the example, if the first row address 212a already stores a row value and the second row address 212b is empty then the row value may be stored in the second row address 212b of the page circuit 104a. In the step 316, the common request circuit 102 may set the ACT_EN flag to a logical one value for the previously stored client request. For example, if the current client request is stored in the third storage location 210c, then the column 206 may be set to a logical one value for the second storage location 210b. Next, the method 300 may move to the step 318.

Figure 8:
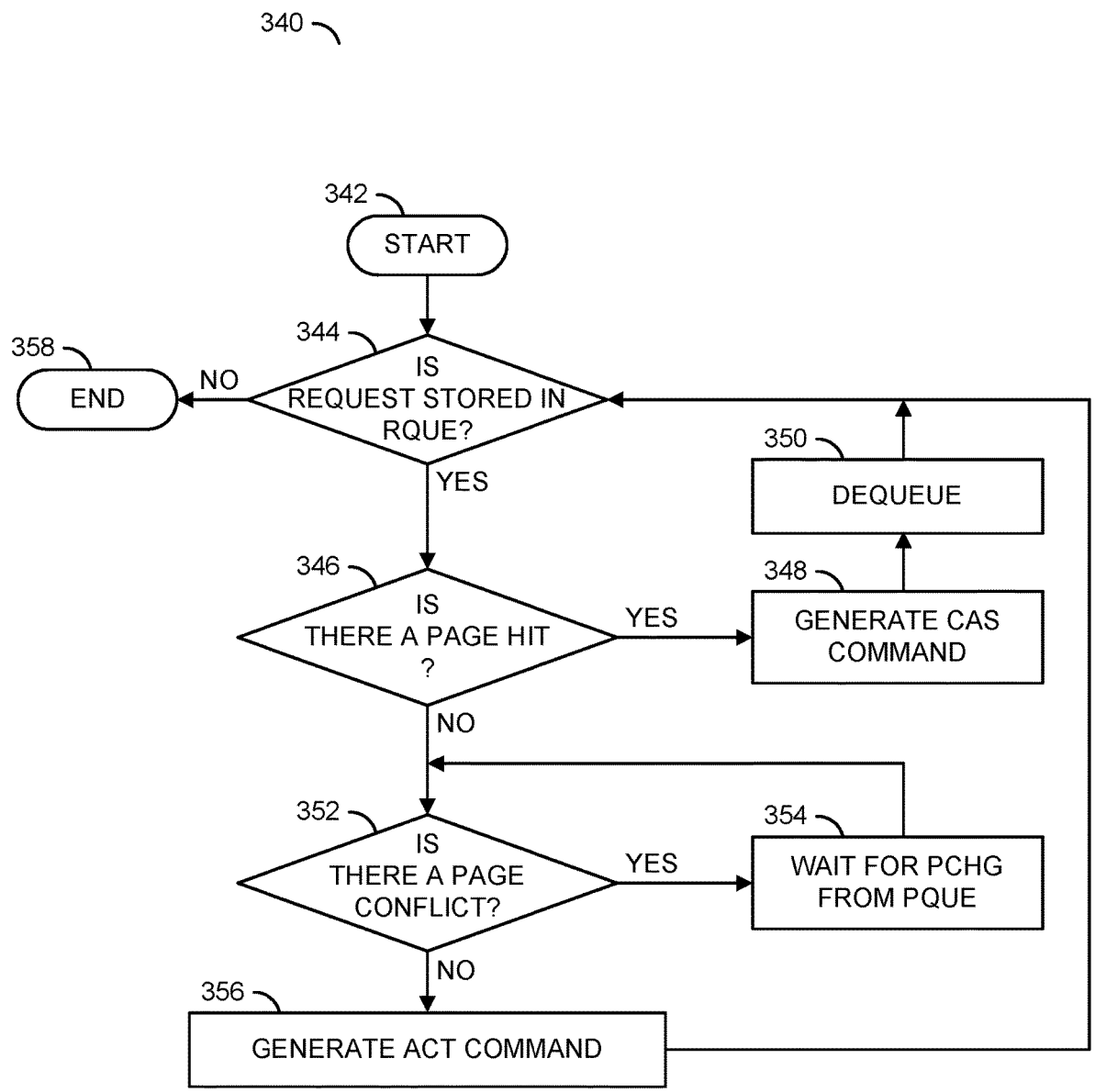
FIG. 8 is a flow diagram illustrating a method for generating commands in response to client requests stored in the common request circuit.

In the step 318, the common request circuit 102 may wait for a next one of the client requests (e.g., the signal CLIENT_REQ). Next (e.g., when a client request is received by the memory controller 60), the method 300 may return to the step 304. Referring to FIG. 8, a method (or process) 340 is shown.

The method 340 may generate commands in response to client requests stored in the common request circuit. The method 340 generally comprises a step (or state) 342, a decision step (or state) 344, a decision step (or state) 346, a step (or state) 348, a step (or state) 350, a decision step (or state) 352, a step (or state) 354, a step (or state) 356, and a step (or state) 358.

The step 342 may start the method 340. In the decision step 344, the common request circuit 102 may determine whether there is a client request stored in the common request circuit 102. If there is a client request stored in the common request circuit 102, then the method 340 may move to the decision step 346. In the decision step 346, the common request circuit 102 may determine whether there is a page hit for the client request. In an example, the common request circuit may 102 receive one of the signals PI_A-PI_M from the page info registers 96a-96m that corresponds with the bank of the client request to determine if there is a page hit. If there is a page hit, then the method 340 may move to the step 348.

In the step 348, the common request circuit 102 may generate the CAS command. Next, in the step 350, the common request circuit 102 may dequeue the client request (e.g., pop the client request off the stack of the common request circuit 102 and move the other client requests stored up to the next highest storage location in the common request circuit 102). Next, the method 340 may return to the decision step 344.

In the decision step 346, if there is not a page hit, then the method 340 may move to the decision step 352. In the decision step 352, the common request circuit 102 may determine whether there is a page conflict. The page conflict may occur when there is a page already open that does not correspond to the current client request. If there is a page conflict, then the method 340 may move to the step 354. In the step 354, the common request circuit 102 may wait for the PCHG command from the one of the page circuits 104a-104m that corresponds to the bank of the current client request. Next, the method 340 may return to the decision step 352.

In the decision step 352, if there is no page conflict, then the common request circuit 102 may generate the ACT command. Next, the method 340 may return to the decision step 344. In the decision step 344, if there is no client request stored by the common request circuit 102, then the method 340 may move to the step 358. The step 358 may end the method 340.

Figure 9:
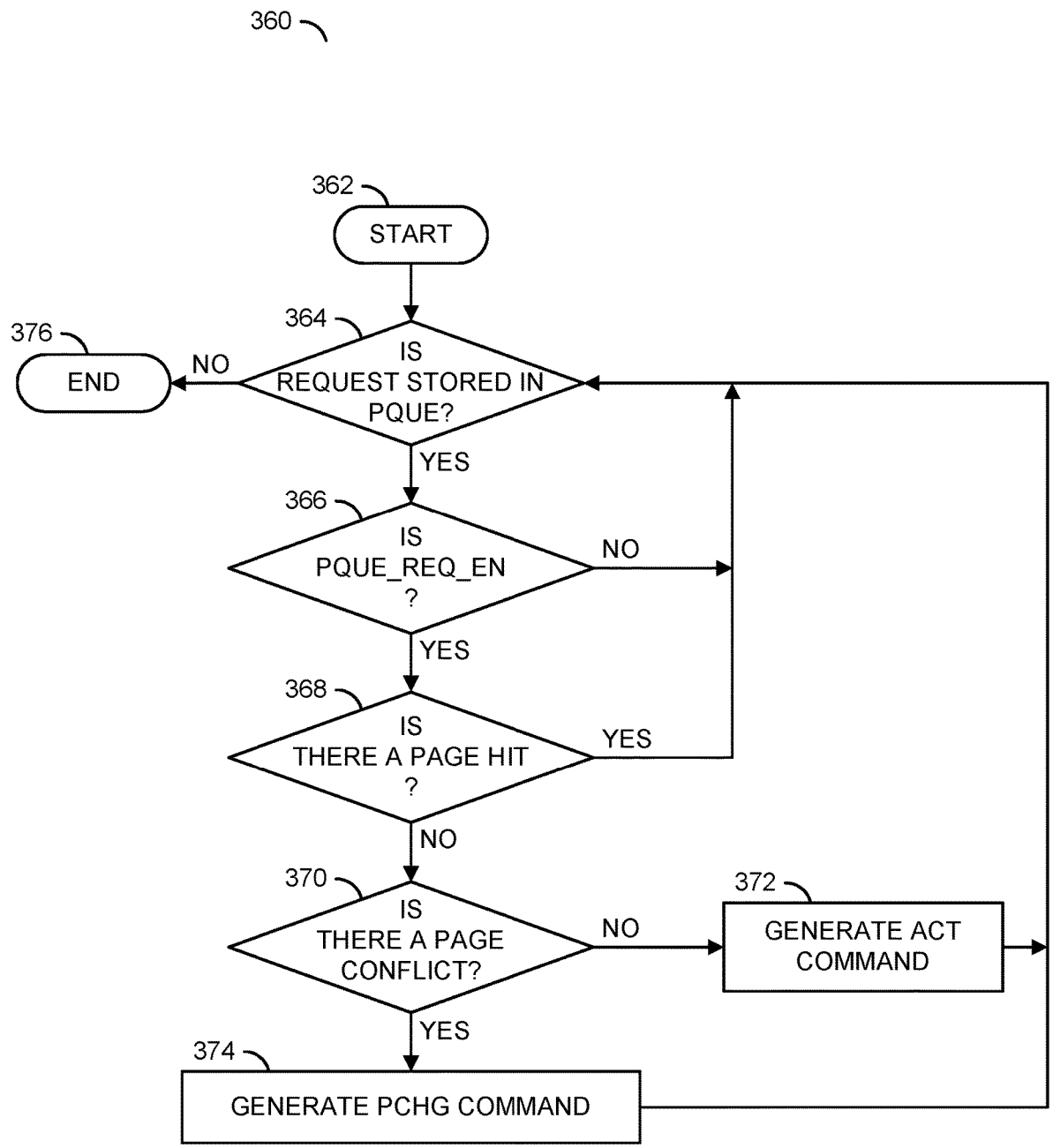
FIG. 9 is a flow diagram illustrating a method for generating commands in response to data stored in the page circuits.

Referring to FIG. 9, a method (or process) 360 is shown. The method 360 may generate commands in response to data stored in the page circuits. The method 360 generally comprises a step (or state) 362, a decision step (or state) 364, a decision step (or state) 366, a decision step (or state) 368, a decision step (or state) 370, a step (or state) 372, a step (or state) 374, and a step (or state) 376.

The step 362 may start the method 360. In the decision step 364, the current one of the page circuits 104a-104m may determine whether there is a client request stored in one of the row locations 212a-212n. If there is a client request stored in one of the row locations 212a-212n, then the method 360 may move to the decision step 366.

In the decision step 366, the current one of the page circuits 104a-104m may determine if the flag PQUE_REQUEST_EN is set. The status flag PQUE_REQUEST_EN may be stored in the page circuits 104a-104m and/or the bank control logic 94a-94m. If the status flag PQUE_REQUEST_EN is not set, then the method 360 may return to the decision step 364. If the status flag PQUE_REQUEST_EN is set, then the method 360 may move to the decision step 368.

In the decision step 368, the current one of the page circuits 104a-104m may determine whether there is a page hit. The corresponding one of the page info registers 96a-96m may be read to determine whether there has been a page hit. If there is a page hit, then the method 360 may return to the decision step 364. If there is not a page hit, then the method 360 may move to the decision step 370.

In the decision step 370, the current one of the page circuits 104a-104m may determine whether there is a page conflict. The page conflict may occur when there is a page already open that does not correspond to the current client request. If there is not a page conflict, then the method 360 may move to the step 372. In the step 372, the current one of the page circuits 104a-104m may generate the signal BQUE_REQ and the arbitration logic 112 may generate the ACT command in response. Next, the method 360 may return to the decision step 364.

In the decision step 370, if there is a page conflict, then the method 360 may move to the step 374. In the step 374, the current one of the page circuits 104a-104m may generate the signal BQUE_REQ and the arbitration logic 112 may generate the PCHG command in response. Next, the method 360 may return to the decision step 364. In the decision step 364, if there are no more requests in the current one of the page circuits 104a-104m, then the method 360 may move to the step 376. The step 376 may end the method 360.

Figure 10:
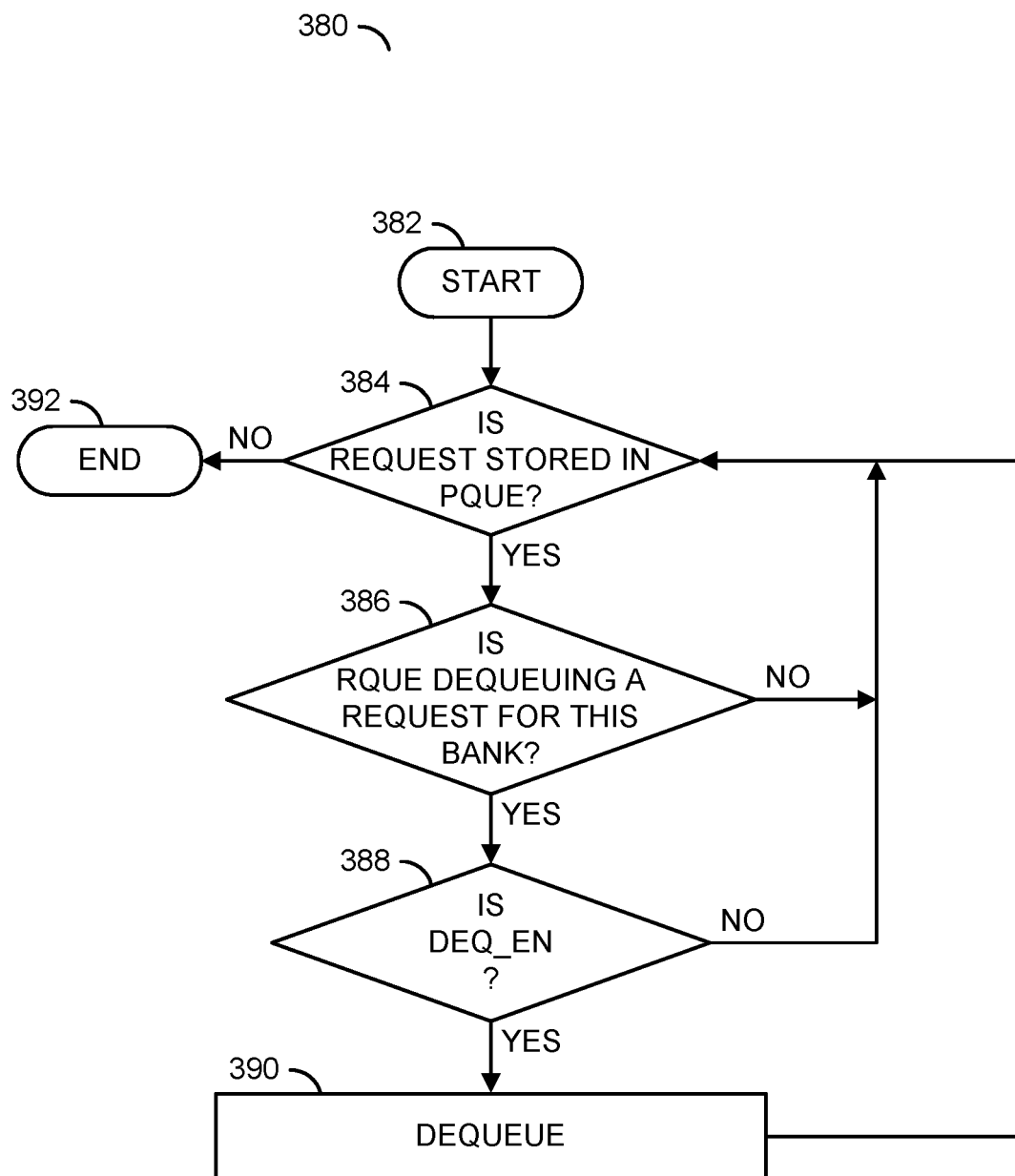
FIG. 10 is a flow diagram illustrating a method for dequeuing the page circuits.

Referring to FIG. 10, a method (or process) 380 is shown. The method 380 may dequeue the page circuits. The method 380 generally comprises a step (or state) 382, a decision step (or state) 384, a decision step (or state) 386, a decision step (or state) 388, a step (or state) 390, and a step (or state) 392.

The step 382 may start the method 380. Next, in the decision step 384, the current one of the page circuits 104a-104m may determine whether there is a client request stored in one of the row locations 212a-212n. If there is a client request stored in one of the row locations 212a-212n, then the method 380 may move to the decision step 386.

In the decision step 386, the current one of the page circuits 104a-104m may determine whether the common request circuit 102 is dequeuing one of the stored client requests (e.g., from the storage locations 210a-210n) that correspond to the bank of the current one of the page circuits 104a-104m. For example, the signal CQUE_INFO_B may indicate the bank value stored (e.g., in the column) for the client request that is dequeuing. If the common request circuit 102 is not dequeuing a client request for the same bank as the current one of the page circuits 104a-104m, then the method 380 may return to the decision step 384. If the common request circuit 102 is dequeuing a client request for the same bank as the current one of the page circuits 104a-104m, then the method 380 may move to the decision step 388.

In the decision step 388, the current one of the page circuits 104a-104m may determine whether the status flag DEQ_EN is set for the client request that is dequeuing. For example, the signal CQUE_INFO_B may indicate the status flag for ACT_EN stored in the column 206 and for DEQ_EN stored in the column 208. If the status flag DEQ_EN is not set (e.g., a logical value of zero), then the method 380 may return to the decision step 384. If the status flag DEQ_EN is set (e.g., a logical value of one), then the method 380 may move to the step 390.

In the step 390, the current one of the page circuits 104a-104m may dequeue the client request stored in the first row location 212a (and increment any row locations 212b-212n to the next one of the row locations 212a-212n). Next, the method 380 may return to the decision step 384. In the decision step 384, if there are no more requests in the current one of the page circuits 104a-104m, then the method 380 may move to the step 392. The step 392 may end the method 380.

Figure 11:
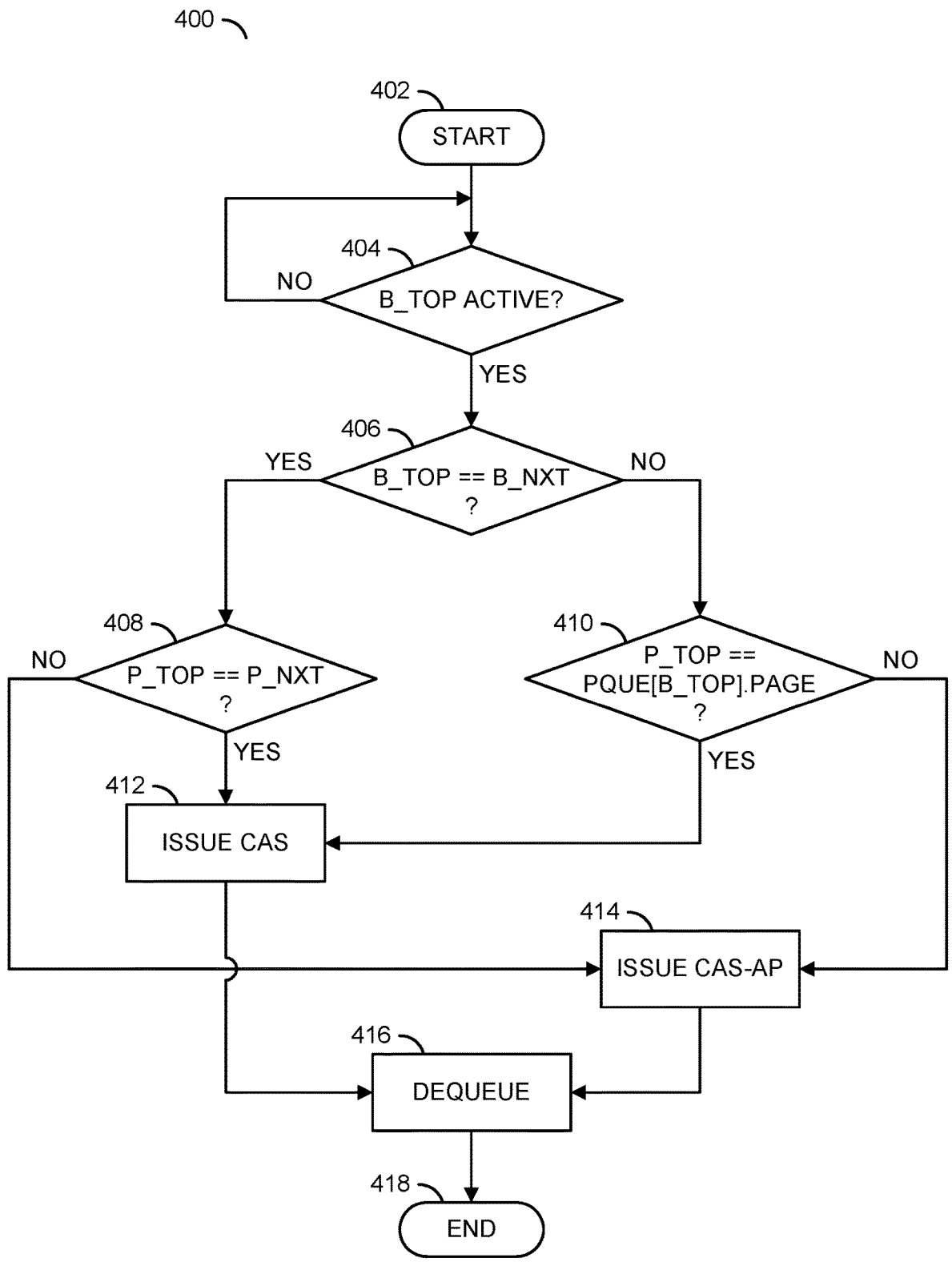
FIG. 11 is a flow diagram illustrating a method for implementing a CAS auto-precharge conversion.

Referring to FIG. 11, a method (or process) 400 is shown. The method 400 may implement a CAS auto-precharge conversion. The method 400 generally comprises a step (or state) 402, a decision step (or state) 404, a decision step (or state) 406, a decision step (or state) 408, a decision step (or state) 410, a step (or state) 412, a step (or state) 414, a step (or state) 416, and a step (or state) 418.

The step 402 may start the method 400. Next, in the decision step 404, the common request circuit 102 may determine whether the memory bank data stored in the top element (e.g., the first storage location 210a) corresponds to one of the memory banks 84a-84m that is active. If the memory bank stored by the first storage location 210a of the common request circuit 102 is not active, then the method 400 may return to the decision step 404. If the memory bank stored by the first storage location 210a is active, then the method 400 may move to the decision step 406.

In the decision step 406, the common request circuit 102 may determine whether the memory bank data stored in the top element (e.g., the storage location 210a) is the same as memory bank data stored in the next element (e.g., the storage location 210b). For example, if the column 204 for the first storage location 210a is B0, then the common request circuit 102 may determine whether the column 204 for the second storage location 210b is also B0. If the memory bank data in the first storage location 210a and the second storage location 210b are the same, then the method 400 may move to the decision step 408.

In the decision step 408, the common request circuit 102 may determine whether the page (e.g., address) stored in the top element (e.g., the storage location 210a) is the same as the page stored in the next element (e.g., the storage location 210b). For example, if the column 204 for the first storage location 210a is R1, then the common request circuit 102 may determine whether the column 204 for the second storage location 210b is also R1. If the page data in the first storage location 210a and the second storage location 210b is the same, then the method 400 may move to the step 412. If the page data in the first location 210a and the second storage location 210b are different, then the method 400 may move to the step 414.

In the decision step 406, if the memory bank data in the first storage location 210a and the second storage location 210b are not the same, then the method 400 may move to the decision step 410. In the decision step 410, the common request circuit 102 may determine whether the page (e.g., address) stored in the top element (e.g., the storage location 210a) is the same as the row address stored in the top element of one of the page circuits 104a-104m corresponding to the active memory bank (e.g., the top row address location 212a). When the memory bank stored in the first storage location 210a is not the same as the memory bank stored in the second storage location 210b, the page circuits 104a-104m may be used to inform the common request circuit 102 as to whether the top of the corresponding one of the page circuits 104a-104m is a page miss. The common request circuit 102 may use the page hit/miss status and peek into the next request to know if the current CAS command may be converted into a CAS with auto precharge. For example, if the column 204 for the first storage location 210a is (B0, R1), then the common request circuit 102 may determine whether the first location 212a for the page circuit 104a (e.g., the page circuit corresponding to the bank B0) is also R1. The common request circuit 102 may determine the row address stored by the page circuits 104a-104m using the signals C A-C M. If the page data in the first storage location 210a of the common request circuit 102 and the first address location 212a of one of the page circuits 104a-104m that corresponds to the same bank is the same, then the method 400 may move to the step 412. If the page data in the first storage location 210a of the common request circuit 102 and the first address location 212a of one of the page circuits 104a-104m that corresponds to the same bank are different, then the method 400 may move to the step 414.

In the step 412, the common request circuit 102 may issue the CAS command. For example, the CAS command may be issued in response to the page data in the first storage location 210a and the second storage location 210b being the same or the page data in the first storage location 210a of the common request circuit 102 being the same as the first address location 212a of one of the page circuits 104a-104m that corresponds to the same bank (e.g., a page hit). Next, the method 400 may move to the step 416.

In the step 414, the common request circuit 102 may issue the CAS-AP command (e.g., the common request circuit 102 may convert the CAS into CAS-AP). For example, the CAS-AP command may be issued in response to the page data in the first storage location 210a and the second storage location 210b being different or the page data in the first storage location 210a of the common request circuit 102 being different than the first address location 212a of one of the page circuits 104a-104m that corresponds to the same bank (e.g., a page miss). Next, the method 400 may move to the step 416.

In the step 416, the common request circuit 102 may dequeue the client request. For example, the client request stored in the first storage location 210a may be popped off the common request circuit 102 and the subsequent client requests stored may be bumped up to the next highest location (e.g., the client request that was stored in the storage location 210b may become the client request in the storage location 210a, the client request that was stored in the storage location 210c may become the client request in the storage location 210b, etc.). Similarly, the first address storage 212a for the one of the page circuits 104a-104m that corresponds to the same bank may be popped off and the subsequent client requests stored may be bumped up to the next highest location (e.g., for the bank B0, the address location 212a of the page circuit 104a may be popped off, and the address that was stored in the address location 212b may become the address stored in the address location 212a, the address that was stored in the address location 212c may become the address stored in the address location 212b, etc.). Next, the method 400 may move to the step 418. The step 418 may end the method 400.

Figure 12:
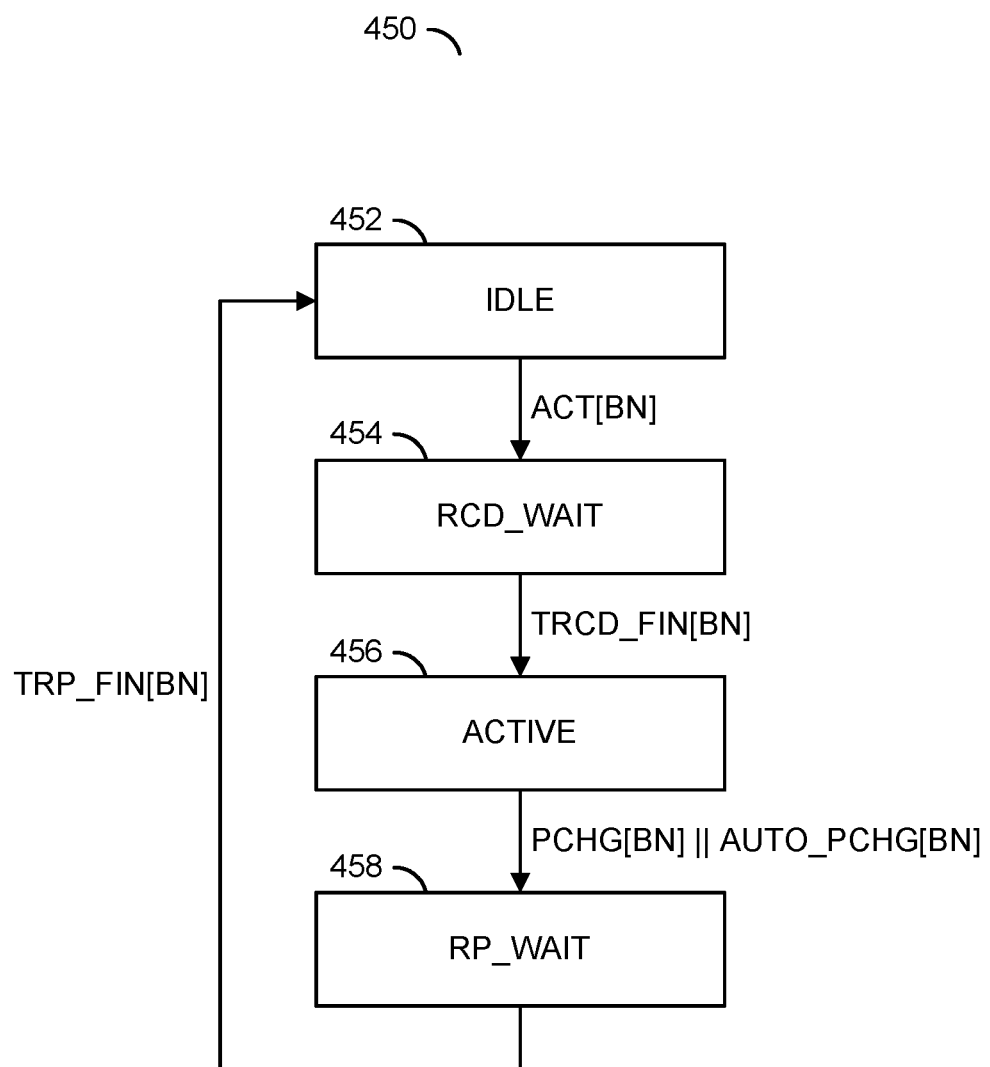
FIG. 12 is a state diagram illustrating a method for a page status management for a single bank of a random access memory.

Referring to FIG. 12, a state diagram illustrating a method for a page status management for a single bank of a random access memory is shown. The state machine 450 generally comprises a step (or state) 452, a step (or state) 454, a step (or state) 456, and a step (or state) 458.

The state machine 450 may be implemented by the state machine logic 120a-120m of the bank controllers 94a-94m in order to manage the page status for the respective memory banks 84a-84m. The bank controllers 94a-94m may be configured to monitor the CAS/ACT commands sent by the common request circuit 102. The bank controllers 94a-94m may be configured to monitor the ACT/PCHG commands sent by the page circuits 104a-104m of the same bank. The bank controllers 94a-94m may monitor bank-relevant timers such as tRCD and tRP to transit the states.

The state 452 may be an idle state. In response to an ACT command for the bank, the state machine 450 may move to the state 454. The state 454 may be a wait state (e.g., RCD_WAIT). For example, in the state 454, the state machine 450 may wait for information from a registered clock driver of the memory 54. In response to the timer tRCD_FIN, the state machine 450 may move to the state 456. The state 456 may be an active state. In response to a precharge command (e.g., PCHG) or an automatic precharge command (e.g., AUTO_PCHG), the state machine 450 may move to the state 458. The state 458 may be a wait state (e.g., RP_WAIT). In response to the timer tRP_FIN, the state machine 450 may return to the idle state 452.

The functions performed by the diagrams of FIGS. 1-12 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a plurality of page circuits each (i) implemented within a respective memory bank controller of a memory bank set and (ii) configured to (a) store an address and (b) determine a page hit status; and
   a common request circuit (i) implemented within said memory bank set and (ii) configured to (a) store client requests and (b) issue a command corresponding to said client requests in response to (A) said page hit status and (B) an order of storage of said client requests, wherein
   (i) said common request circuit is shared between each of said memory bank controllers of said memory bank set,
   (ii) said memory bank controllers are configured to control access to a memory,
   (iii) said common request circuit and said page circuits are configured to provide a preview of upcoming client requests to said memory, and
   (iv) said preview of said upcoming client requests configures said memory bank controllers to perform page management for said memory by opening and closing a page based on said upcoming client requests.

2. The apparatus according to claim 1, wherein said page circuits comprise half a storage depth of said common request circuit.

3. The apparatus according to claim 1, wherein said preview is provided by a buffering scheme implemented by said common request circuit and said page circuits based on said address, said client requests and said page hit.

4. The apparatus according to claim 1, wherein said client requests are buffered by sharing data about said upcoming client requests between said common request circuit and said plurality of page circuits.

5. The apparatus according to claim 1, wherein said memory bank controllers are configured to adjust access to said memory to prevent bandwidth loss during a page miss scenario in response to said preview of said upcoming client requests.

6. The apparatus according to claim 1, wherein each of said page circuits implement a first-in-first-out queue configured to indicate said page hit status of said upcoming client requests without affecting an order that said client requests are serviced by said common request circuit.

7. The apparatus according to claim 6, wherein said common request circuit is configured to analyze a next of said client requests in said order of said client requests and a top request in one of said page circuits to determine whether to convert said command to said command with an automatic precharge in response to said page hit status providing an indication of a page miss.

8. The apparatus according to claim 1, wherein said command comprises an activate command when a page of said memory corresponding to a current one of said client requests is closed.

9. The apparatus according to claim 1, wherein (i) said common request circuit is shared by each of said memory bank controllers in said memory bank set, (ii) said memory bank set is one of a plurality of memory bank sets in said memory and (iii) said apparatus is implemented in each of said plurality of said memory bank sets.

10. The apparatus according to claim 1, wherein said plurality of page circuits and said common request circuit are configured to implement a request buffering scheme.

11. A method for implementing a request buffering scheme in a random access memory, comprising the steps of:
   storing an address in one of a plurality of page circuits;
   determining a page hit status;
   storing client requests in a common request circuit;
   issuing a command corresponding to said client requests in response to (A) said page hit status and (B) an order of storage of said client requests; and
   performing page management for said random access memory by opening and closing a page based on upcoming client requests, wherein
   (i) said page circuits (a) are implemented within a respective memory bank controller of a memory bank set and (b) comprise half a storage depth of said common request circuit,
   (ii) said common request circuit is (a) implemented within said memory bank set and (b) shared between each memory bank controller of a memory bank set,
   (iii) said memory bank controller is configured to control access to said random access memory,
   (iv) said common request circuit and said page circuits are configured to provide a buffering scheme based on said address, said client requests and said page hit status that configures said common request circuit to preview said upcoming client requests to said random access memory, and
   (v) said preview of said upcoming client requests configures said memory bank controllers to perform said page management.

12. The method according to claim 11, wherein said memory bank controllers are configured to adjust access to said random access memory to prevent bandwidth loss during a page miss scenario in response to said preview of said upcoming client requests.

13. The method according to claim 11, wherein each of said page circuits implement a first-in-first-out queue configured to indicate said page hit status of said upcoming client requests without affecting an order that said client requests are serviced by said common request circuit.

14. The method according to claim 11, further comprising the steps of:
   generating a page management command from one of said page circuits for said address in response to (a) a request at a top element of said respective page circuits, (b) said page hit status and (c) when said common request circuit configures said page management command; and
   issuing said page management command to an arbitration logic for page management of said random access memory, wherein said page management command comprises one of a precharge command and an activate command.

15. The method according to claim 14, wherein said common request circuit is configured to issue said page management command to said arbitration logic if one of said page circuits fails to issue said page management command before said page management command reaches a top of said common request circuit if said page hit status is a miss.

16. The method according to claim 14, wherein each of said page circuits are configured to (i) determine said page hit status for said top element by checking a page status register, (ii) generate said page management command if said page hit status is a miss and (iii) not generate said page management command if said page hit status is a hit.

17. The method according to claim 14, further comprising the steps of:
    issuing said page management command at said top element of said respective page circuits in response to a first enable value stored in said common request circuit; and
    popping said address and said page management command stored with said address from said top element of said respective page circuits in response to a second enable value stored in said common request circuit.

18. The method according to claim 17, wherein (i) said first enable value is set to a logical high for a previous entry in said common request circuit in response to a bank switch and (ii) said second enable value is set to a logical high for a current entry in said common request circuit in response to said bank switch.

19. The method according to claim 11, further comprising the step of:
    removing one of said client requests from said order of storage of said client requests when said command corresponding to said one of said client requests is issued.

20. The method according to claim 11, further comprising the step of:
    pushing said address into one of said page circuits in response to a bank switch.

* * * * *